US012406929B2

(12) United States Patent
Roh et al.

(10) Patent No.: US 12,406,929 B2
(45) Date of Patent: Sep. 2, 2025

(54) SEMICONDUCTOR MEMORY DEVICE

(71) Applicant: SAMSUNG ELECTRONICS CO., LTD., Suwon-si (KR)

(72) Inventors: Inho Roh, Seoul (KR); Donghwa Kwak, Suwon-si (KR); Kyung Don Mun, Asan-si (KR); Wonsok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 535 days.

(21) Appl. No.: 17/896,241

(22) Filed: Aug. 26, 2022

(65) Prior Publication Data

US 2023/0187352 A1    Jun. 15, 2023

(30) Foreign Application Priority Data

Dec. 10, 2021    (KR) .................. 10-2021-0176536

(51) Int. Cl.
*H01L 23/528*       (2006.01)
*H01L 23/522*       (2006.01)
*H10B 12/00*        (2023.01)

(52) U.S. Cl.
CPC ...... *H01L 23/5283* (2013.01); *H01L 23/5226* (2013.01); *H10B 12/0335* (2023.02); *H10B 12/053* (2023.02); *H10B 12/315* (2023.02); *H10B 12/34* (2023.02); *H10B 12/482* (2023.02); *H10B 12/488* (2023.02)

(58) Field of Classification Search
CPC ............ H01L 23/5283; H01L 23/5226; H10B 12/0335; H10B 12/053; H10B 12/315; H10B 12/34; H10B 12/482; H10B 12/488
See application file for complete search history.

(56) References Cited

U.S. PATENT DOCUMENTS

| | | | |
|---|---|---|---|
| 8,227,847 | B2 | 7/2012 | Neuilly et al. |
| 8,482,009 | B2 | 7/2013 | Dyer et al. |
| 8,759,947 | B2 | 6/2014 | Tan et al. |
| 9,455,151 | B2 | 9/2016 | Bauer et al. |
| 9,496,383 | B2 | 11/2016 | Oyu et al. |
| 9,786,598 | B2 | 10/2017 | Kim et al. |
| 10,879,347 | B2 | 12/2020 | Murase et al. |
| 10,991,793 | B2 | 4/2021 | Lu et al. |
| 2012/0281490 | A1 | 11/2012 | Cho |
| 2019/0304978 | A1 | 10/2019 | Wang |
| 2020/0411636 | A1 | 12/2020 | Kao et al. |
| 2021/0134808 | A1 | 5/2021 | Kim et al. |

FOREIGN PATENT DOCUMENTS

| | | |
|---|---|---|
| JP | 2015-053447 A | 3/2015 |
| TW | 2012-46461 A1 | 11/2012 |

*Primary Examiner* — Samuel A Gebremariam
(74) *Attorney, Agent, or Firm* — Muir Patent Law, PLLC

(57) ABSTRACT

A semiconductor memory device includes a substrate including active regions, the active regions having first impurity regions and second impurity regions, word lines on a first surface of the substrate, the word lines extending in a first direction, first bit lines on the word lines, the first bit lines extending in a second direction crossing the first direction, and the first bit lines being connected to the first impurity regions, first contact plugs between the first bit lines, the first contact plugs being connected to the second impurity regions, respectively, second bit lines on a second surface of the substrate, the second bit lines being electrically connected to the first impurity regions, and a first capacitor on the first contact plugs.

20 Claims, 20 Drawing Sheets

SEMICONDUCTOR MEMORY DEVICE

CROSS-REFERENCE TO RELATED APPLICATION

This U.S. non-provisional patent application claims priority under 35 U.S.C. § 119 to Korean Patent Application No. 10-2021-0176536, filed on Dec. 10, 2021, in the Korean Intellectual Property Office, the entire contents of which are hereby incorporated by reference.

BACKGROUND

1. Field

The present disclosure relates to a semiconductor device, and in particular, to a semiconductor memory device and a method of fabricating the same.

2. Description of the Related Art

Due to their small-size, multifunctionality, and/or low-cost characteristics, semiconductor memory devices are being esteemed as important elements in the electronic industry. With the advancement of the electronic industry, there is an increasing demand for highly-integrated semiconductor memory devices. For example, highly-integrated semiconductor memory devices may require reduced linewidths of patterns constituting the semiconductor memory device.

SUMMARY

According to an embodiment, a semiconductor memory device may include a substrate including active regions including first impurity regions and second impurity regions, word lines provided on a first surface of the substrate and extended in a first direction, first bit lines provided on the word lines, extended in a second direction crossing the first direction, and connected to the first impurity regions, first contact plugs provided between the first bit lines and connected to the second impurity regions, respectively, second bit lines provided on a second surface of the substrate and electrically connected to the first impurity regions, and a first capacitor on the first contact plugs.

According to an embodiment, a semiconductor memory device may include a substrate including active regions including first impurity regions and second impurity regions, word lines provided on a first surface of the substrate and extended in a first direction, first bit lines provided on the word lines, extended in a second direction crossing the first direction, and connected to the first impurity regions, first contact plugs provided between the first bit lines and connected to the second impurity regions, respectively, a first capacitor on the first contact plugs, second contact plugs provided on a second surface of the substrate and electrically connected to the second impurity regions, and a second capacitor provided on bottom surfaces of the second contact plugs.

According to an embodiment, a semiconductor memory device may include a substrate including active regions including first impurity regions and second impurity regions, word lines provided on a first surface of the substrate and extended in a first direction, first bit lines provided on the word lines, extended in a second direction crossing the first direction, and connected to the first impurity regions, first contact plugs provided between the first bit lines and connected to the second impurity regions, respectively, second bit lines provided on a second surface of the substrate and electrically connected to the first impurity regions, and a first capacitor provided on the first contact plugs. The first capacitor may include bottom electrodes and a top electrode, and the first and second bit lines may be alternatively disposed in the first direction, when viewed in a plan view.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
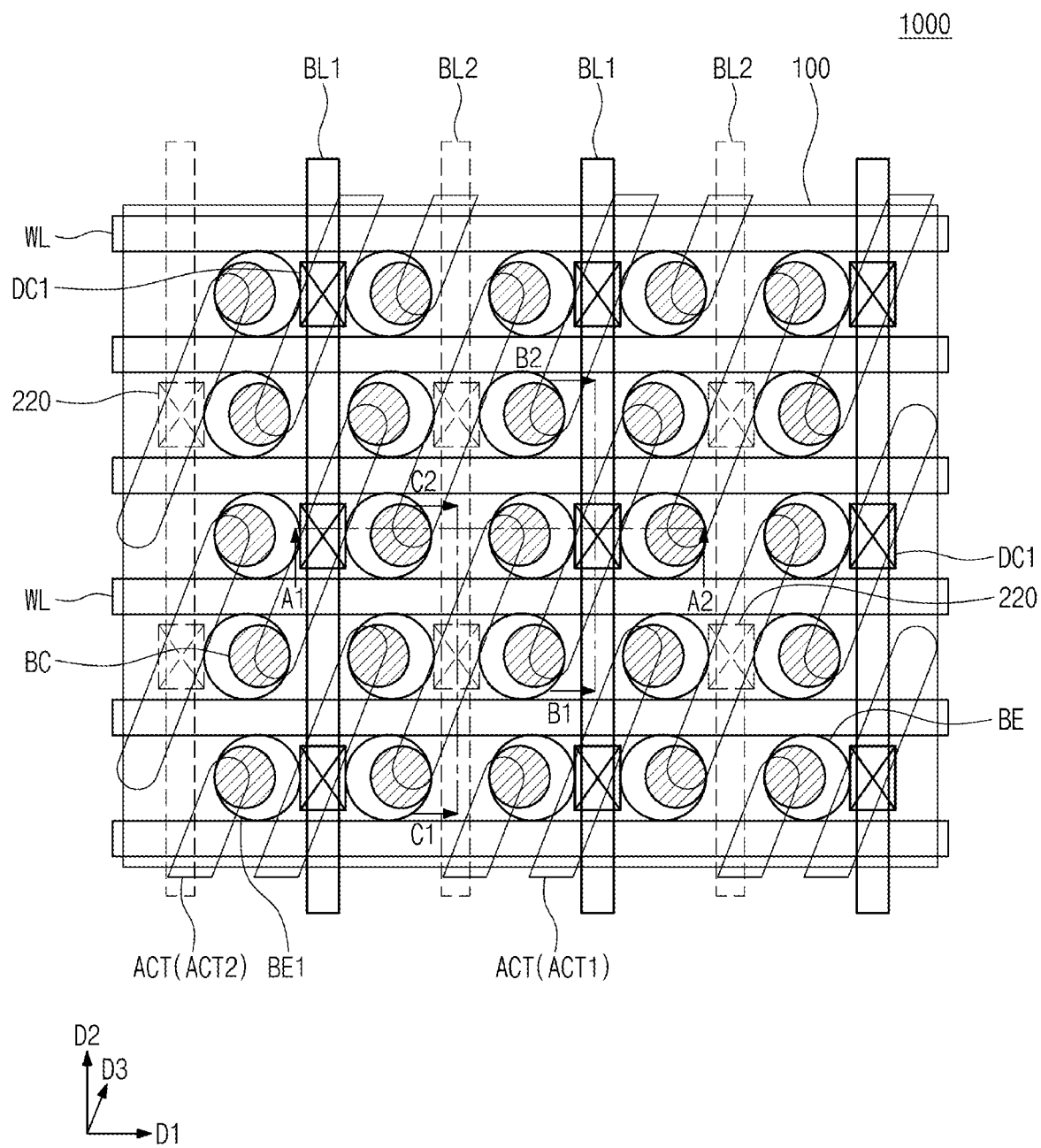
FIG. 1 illustrates a plan view of a semiconductor memory device according to an embodiment.
Figure 2A:
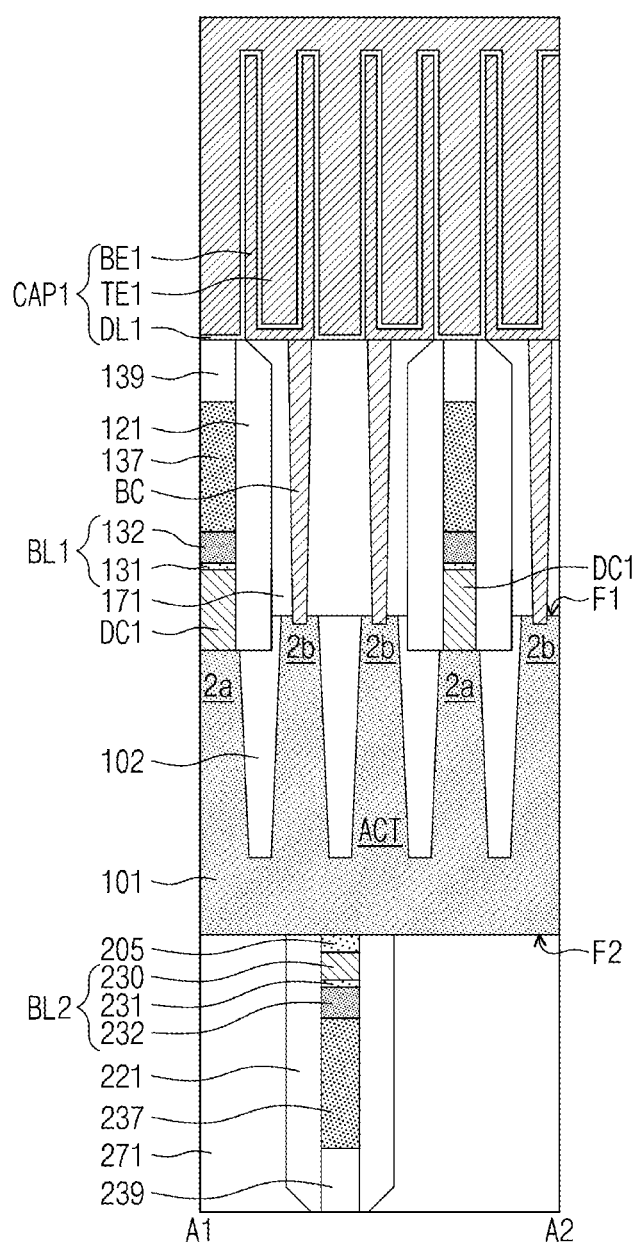
FIG. 2A illustrates a cross-sectional view along line A1-A2 of FIG. 1.
Figure 2B:
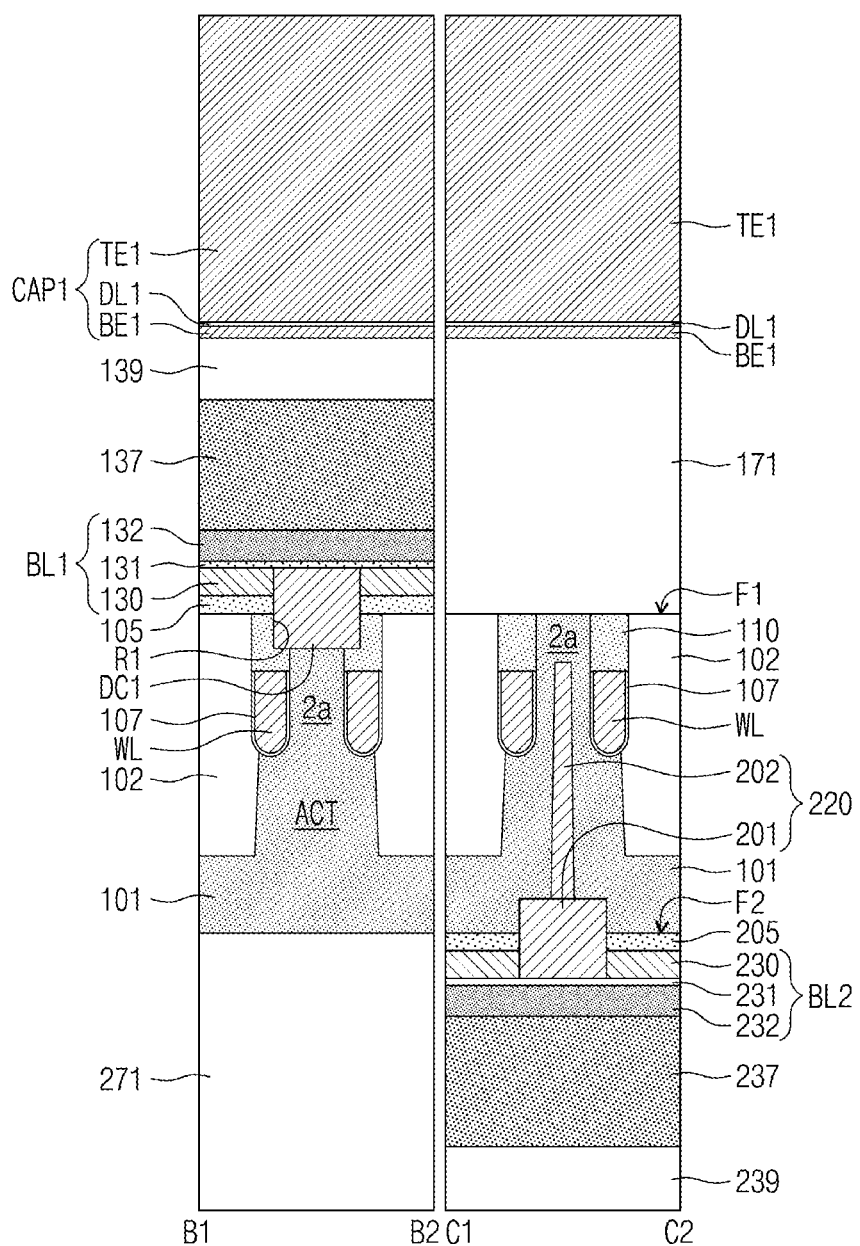
FIG. 2B illustrates cross-sectional views along lines B1-B2 and C1-C2 of FIG. 1.

FIG. 1 is a plan view illustrating a semiconductor memory device 1000 according to an embodiment. FIG. 2A is a cross-sectional view taken along lines A1-A2 and B1-B2 of FIG. 1. FIG. 2B is a cross-sectional view taken along line C1-C2 of FIG. 1.

Referring to FIGS. 1, 2A, and 2B, a substrate 101 including a first surface F1 and a second surface F2 may be provided. The substrate 101 may be a semiconductor substrate (e.g., a single-crystalline silicon substrate). The first surface F1 and the second surface F2 may be opposite to each other. As an example, the first surface F1 may be a front side of the substrate 101, and the second surface F2 may be a back side of the substrate 101. A device isolation pattern 102 may be disposed in a portion of the substrate 101 near the first surface F1 to define active regions ACT. Each of the active regions ACT may have an isolated shape. When viewed in a plan view, each of the active regions ACT may be a bar-shaped pattern elongated in a third direction D3. When viewed in a plan view, the active regions ACT may correspond to portions of the substrate 101 enclosed by the device isolation pattern 102. The active regions ACT may be arranged in the third direction D3 to be parallel to each other, and each of the active regions ACT may be disposed such that an end portion thereof is located near a center of another of the active regions ACT.

The active regions ACT may be arranged to form a plurality of columns, which are parallel to a second direction D2 and are spaced apart from each other in a first direction D1. In other words, the active regions ACT in each column may be arranged in the second direction D2. The active regions ACT constituting even-numbered columns will be referred to as first active regions ACT1, and the active regions ACT constituting odd-numbered columns will be referred to as second active regions ACT2.

Word lines WL may be provided to cross the active regions ACT. The word lines WL may be respectively disposed in grooves which are formed in the device isolation pattern 102 and the active regions ACT. The word lines WL may be parallel to the first direction D1 crossing the third direction D3. The word lines WL may be formed of or include at least one of conductive materials. As an example, the word lines WL may be formed of or include, e.g., at least one of metallic materials, conductive metal nitride materials, or doped semiconductor materials.

A gate dielectric layer 107 may be disposed between the word line WL and an inner surface of the groove. The gate dielectric layer 107 may be formed of or include, e.g., at least one of thermal oxide, silicon nitride, silicon oxynitride, or high-k dielectric materials. Each of the active regions ACT may be provided to cross a pair of the word lines WL.

A first impurity region 2a may be disposed in a portion of each active region ACT between the pair of the word lines WL, and a pair of second impurity regions 2b may be disposed in opposite edge portions of each active region ACT. The first and second impurity regions 2a and 2b may be, e.g., n-type doped regions. The first impurity region 2a may correspond to a common drain region, and the second impurity region 2b may correspond to a source region. Each of the word lines WL and the first and second impurity regions 2a and 2b adjacent thereto may constitute a transistor.

Top surfaces of the word lines WL may be lower than top surfaces of the active regions ACT. A word line capping pattern 110 may be disposed on each word line WL. The word line capping pattern 110 may be a line-shaped pattern, which is extended in a length direction of the word line WL, and may cover the top surface of the word line WL. The word line capping pattern 110 may be formed of or include at least one of, e.g., silicon nitride or silicon oxide.

A first buffer insulating pattern 105 may be disposed on the substrate 101. The first buffer insulating pattern 105 may be formed of or include at least one of, e.g., silicon oxide, silicon nitride, or silicon oxynitride and may have a single- or multi-layered structure. The first buffer insulating pattern 105 may be formed to have an isolated island shape, when viewed in a plan view. The first buffer insulating pattern 105 may be provided to cover end portions of a pair of the active portions ACT, which are adjacent to each other.

First recess regions R1, which are formed by partially recessing upper portions of the substrate 101, the device isolation pattern 102, and the word line capping pattern 110, may be provided. First bit lines BL1 may be disposed on the first surface F1 of the substrate 101. The first bit lines BL1 may be provided to cross the word line capping patterns 110 and the word lines WL. As shown in FIG. 1, the first bit lines BL1 may be extended in the second direction D2 crossing the first and third directions D1 and D3, and may be connected to the first impurity regions 2a. More specifically, the first bit lines BL1 may be connected to the first impurity regions 2a of the first active regions ACT1.

The first bit lines BL1 may include a semiconductor pattern 130, an ohmic pattern 131, and a metal-containing pattern 132, which are sequentially stacked. The semiconductor pattern 130 may be formed of or include, e.g., doped or undoped polysilicon. The ohmic pattern 131 may be formed of or include, e.g., at least one of metal silicide materials. For example, the metal-containing pattern 132 may be formed of or include at least one of metallic materials (e.g., tungsten, titanium, and tantalum) or conductive metal nitride materials (e.g., titanium nitride, tantalum nitride, and tungsten nitride). Bit line capping patterns 137 may be disposed on the first bit lines BL1, respectively. For example, the bit line capping patterns 137 may be formed of or include at least one of insulating materials (e.g., silicon nitride).

First contact plugs DC1 may be disposed in the first recess regions R1 crossing the first bit lines BL1. The first contact plugs DC1 may be formed of or include, e.g., doped or undoped polysilicon. Each of the first contact plugs DC1 may be electrically connected to a corresponding one of the first impurity regions 2a. Each of the first bit lines BL1 may be electrically connected to a plurality of the first impurity regions 2a through the first contact plugs DC1.

Second contact plugs BC may be disposed between an adjacent pair of the first bit lines BL1. The second contact plugs BC may be provided to penetrate a first interlayer insulating layer 171 filling a region between the first bit lines BL1 and may be connected to the second impurity regions 2b. As shown in FIG. 1, the second contact plugs BC may be disposed to be two-dimensionally spaced apart from each other. For example, the second contact plugs BC may be formed of or include at least one of doped or undoped polysilicon or metallic materials (e.g., tungsten). The first interlayer insulating layer 171 may include, e.g., a silicon oxide layer.

Spacers 121 may be provided on side surfaces of the first bit lines BL1. The spacers 121 may be provided to cover a side surface of the first bit line BL1 and a side surface of the bit line capping pattern 137. The spacers 121 may be extended to cover a side surface of the first contact plug DC1. Each of the spacers 121 may include a plurality of insulating layers. As an example, a first insulating layer and a third insulating layer may be formed of or include the same material, and a second insulating layer may be formed of or include a material different from the first and third insulating layers. For example, the first and third insulating layers may be formed of or include silicon nitride, and the second insulating layer may be formed of or include silicon oxide and/or silicon oxynitride. Alternatively, an air gap may be provided in place of the second insulating layer.

First bottom electrodes BE1 may be disposed on the second contact plugs BC, respectively. For example, the first bottom electrode BE1 may be formed of or include at least one of doped poly-silicon, metal nitride materials (e.g., titanium nitride), or metallic materials (e.g., tungsten, aluminum, and copper). The first bottom electrode BE1 may have a circular pillar shape, a hollow cylinder shape, or a cup shape.

A first dielectric layer DL1 may be provided to cover top and side surfaces of the first bottom electrodes BE1. The first dielectric layer DL1 may be extended to regions on top surfaces of landing pads and a top surface of a gapfill layer. The first dielectric layer DL1 may be covered with a first top electrode TE1. For example, an interface layer may be provided between the first dielectric layer DL1 and the first bottom electrodes BE1. For example, the first dielectric layer DL1 may be formed of or include a metal oxide layer, e.g., the metal in the metal oxide layer may include at least one of hafnium (Hf), niobium (Nb), titanium (Ti), tantalum (Ta), zirconium (Zr), chromium (Cr), cobalt (Co), iridium (Ir), molybdenum (Mo), osmium (Os), rhenium (Ra), rhodium (Rh), ruthenium (Ru), tungsten (W), or vanadium (V).

A plurality of layers may be provided between the first bottom electrodes BE1 and the second contact plugs BC. As an example, the landing pads may be provided to connect the first bottom electrodes BE1 to the second contact plugs BC. The landing pads may be formed of or include a metal-containing material (e.g., tungsten). A gapfill layer may be provided to fill a space between the landing pads. The gapfill layer may have a shape filling a region between the landing pads, which are two-dimensionally spaced apart from each other. As an example, a planar shape of the gapfill layer may be a mesh shape including holes which are pierced by the landing pads. The gapfill layer may be formed of or include, e.g., at least one of silicon oxide or silicon oxynitride.

For example, the first top electrode TE1 may be formed of or include at least one of doped poly-silicon, doped silicon-germanium, metal nitride materials (e.g., titanium nitride), or metallic materials (e.g., tungsten, aluminum, and copper). The first bottom electrodes BE1, the first dielectric layer DL1, and the first top electrode TE1 may constitute a first capacitor CAP1. Accordingly, the semiconductor memory device 1000 including the first capacitor CAP1 may be provided.

Second bit lines BL2 may be provided on the second surface F2 of the substrate 101, e.g., the substrate 101 may be between the first bit lines BL1 and the second bit lines BL2. Each of the second bit lines BL2 may be extended in the second direction D2. A second buffer insulating pattern 205 may be provided between the second surface F2 of the substrate 101 and the second bit lines BL2. The second buffer insulating pattern 205 may be formed of or include, e.g., at least one of silicon oxide, silicon nitride, or silicon oxynitride, and may have a single- or multi-layered structure. The second bit lines BL2 may be electrically connected to the first impurity regions 2a of the second active regions ACT2. When viewed in a plan view, as shown in FIG. 1, the first bit lines BL1 and the second bit lines BL2 may be alternately and repeatedly disposed in the first direction D1. The arrangement of the first and second bit lines BL1 and BL2 may not be limited thereto and may be changed in consideration of the arrangement of the active regions ACT. The number of the first bit lines BL1 may be equal to the number of the second bit lines BL2. A core circuit may be designed such that a pair of bit lines, which are respectively chosen from the first and second bit lines BL1 and BL2, are operated in a paired manner.

The second bit lines BL2 may be provided to have the same or similar structure as the first bit lines BL1. As an example, the second bit lines BL2 may include a semiconductor pattern 230, an ohmic pattern 231, and a metal-containing pattern 232, which are sequentially stacked on the second surface F2 of the substrate 101. The semiconductor pattern 230 may be formed of or include, e.g., doped or undoped polysilicon. The ohmic pattern 231 may be formed of or include, e.g., at least one of metal silicide materials. For example, the metal-containing pattern 232 may be formed of or include at least one of metallic materials (e.g., tungsten, titanium, and tantalum) or conductive metal nitride materials (e.g., titanium nitride, tantalum nitride, and tungsten nitride). The metal-containing pattern 232 may be formed of or include, e.g., ruthenium (Ru) and/or molybdenum (Mo). The layers and materials constituting the second bit lines BL2 are not limited thereto. As an example, the second bit lines BL2 may not include the semiconductor pattern 230 and the ohmic pattern 231, unlike the first bit lines BL1.

Bit line capping patterns 237 may be disposed on the second bit lines BL2, respectively. For example, the bit line capping patterns 237 may be formed of or include at least one of insulating materials (e.g., silicon nitride). Third mask patterns 239 may be provided on the bit line capping patterns 237, e.g., the bit line capping pattern 237 may be between the third mask pattern 239 and the second bit line BL2.

Connection conductive patterns 220 may be provided to connect the second bit lines BL2 to the first impurity regions 2a of the second active regions ACT2. Each of the connection conductive patterns 220 may include a conductive structure, which is extended from the second surface F2 of the substrate 101 toward the first surface F1, e.g., the connection conductive pattern 220 may extend through the substrate 101. As an example, the connection conductive pattern 220 may include a first penetration via 201, which is connected to the second bit line BL2, and a second penetration via 202, which is provided to connect the first penetration via 201 to the first impurity region 2a of the second active region ACT2. As an example, the first penetration via 201 may be provided to penetrate the second buffer insulating pattern 205 and the semiconductor pattern 230, and may be connected to the ohmic pattern 231. A top surface (i.e., a surface facing away from the second bit line BL2) of the first penetration via 201 may be located at a height that is lower than a bottom surface (i.e., a surface facing the second bit line BL2) of the device isolation pattern 102, e.g., a distance from the top surface of the first penetration via 201 to the bit line capping pattern 237 may be smaller than a distance from a bottom surface of the device isolation pattern 102 to the bit line capping patterns 237. For example, the first and second penetration vias 201 and 202 may be formed of or include at least one of tungsten, titanium, tantalum, and/or conductive nitrides thereof. For example, the first and second penetration vias 201 and 202 may be directly connected to the substrate 101. In another example, an insulating layer may be provided between the first and second penetration vias 201 and 202 and the substrate 101.

The second penetration via 202 may be extended from the top surface of the first penetration via 201 into the first impurity region 2a. As an example, a top surface of the second penetration via 202 may be higher than bottom surfaces of the word lines WL, e.g., relative to the second surface F2 of the substrate 101. The second penetration via 202 may be extended into a region between the word lines WL. A width of the first penetration via 201 may be larger than a width of the second penetration via 202, e.g., along the second direction D2.

The second bit lines BL2 may be provided in a second interlayer insulating layer 271, which is formed on the second surface F2 of the substrate 101. The second interlayer insulating layer 271 may include, e.g., a silicon oxide layer. Spacers 221 may be provided between side surfaces of the second bit lines BL2 and the second interlayer insulating layer 271.

According to an embodiment, some of the bit lines may be disposed on the first surface of the substrate, and the others may be disposed on the second surface of the substrate, e.g., the first and second bit lines BL1 and BL2 may be disposed on opposite surfaces of the substrate 101. Accordingly, it may be possible to increase a process margin in a process of forming the bit lines, thereby increasing an integration density of the semiconductor memory device.

Figure 3:
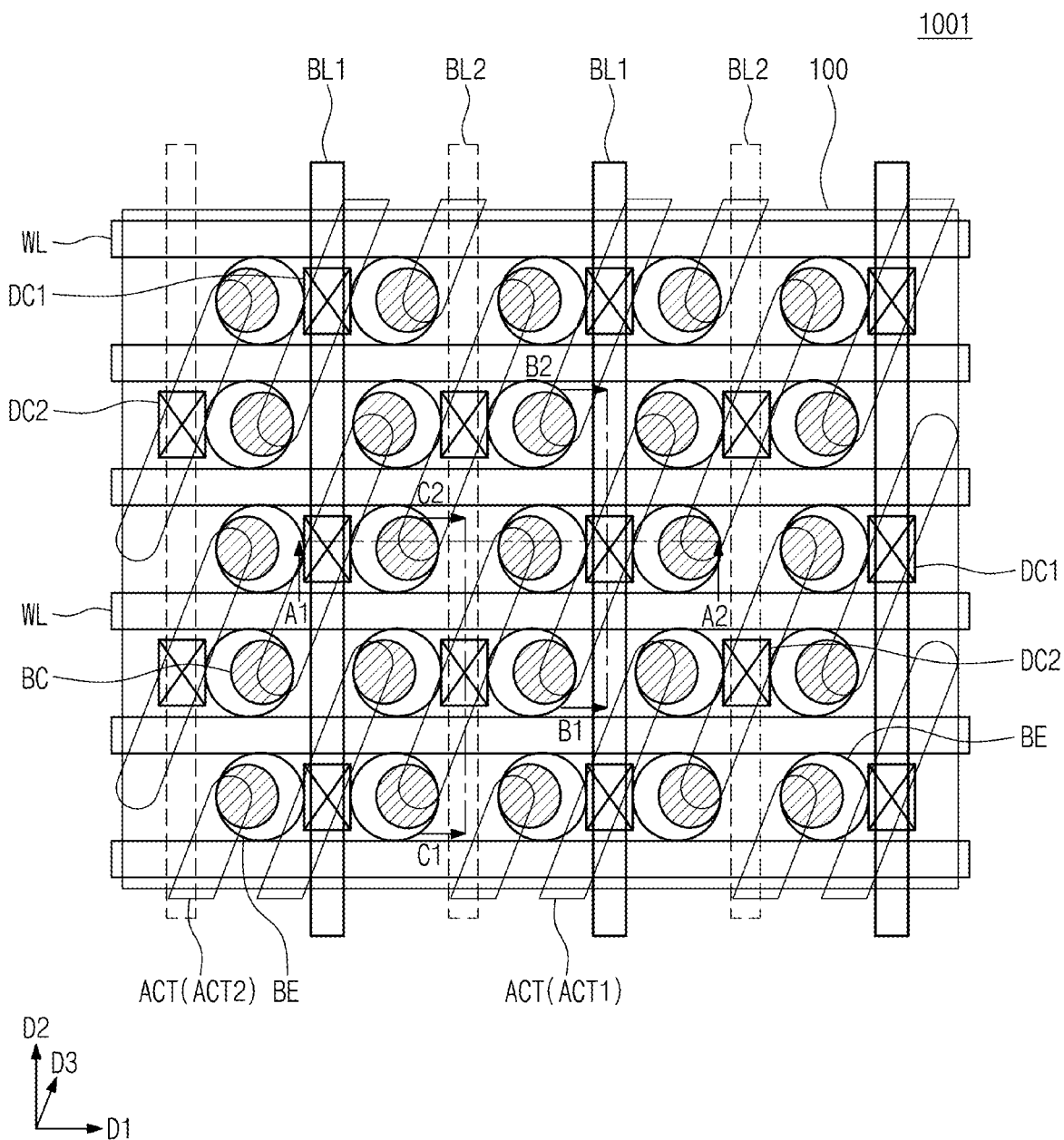
FIG. 3 illustrates a plan view of a semiconductor memory device according to an embodiment.
Figure 4:
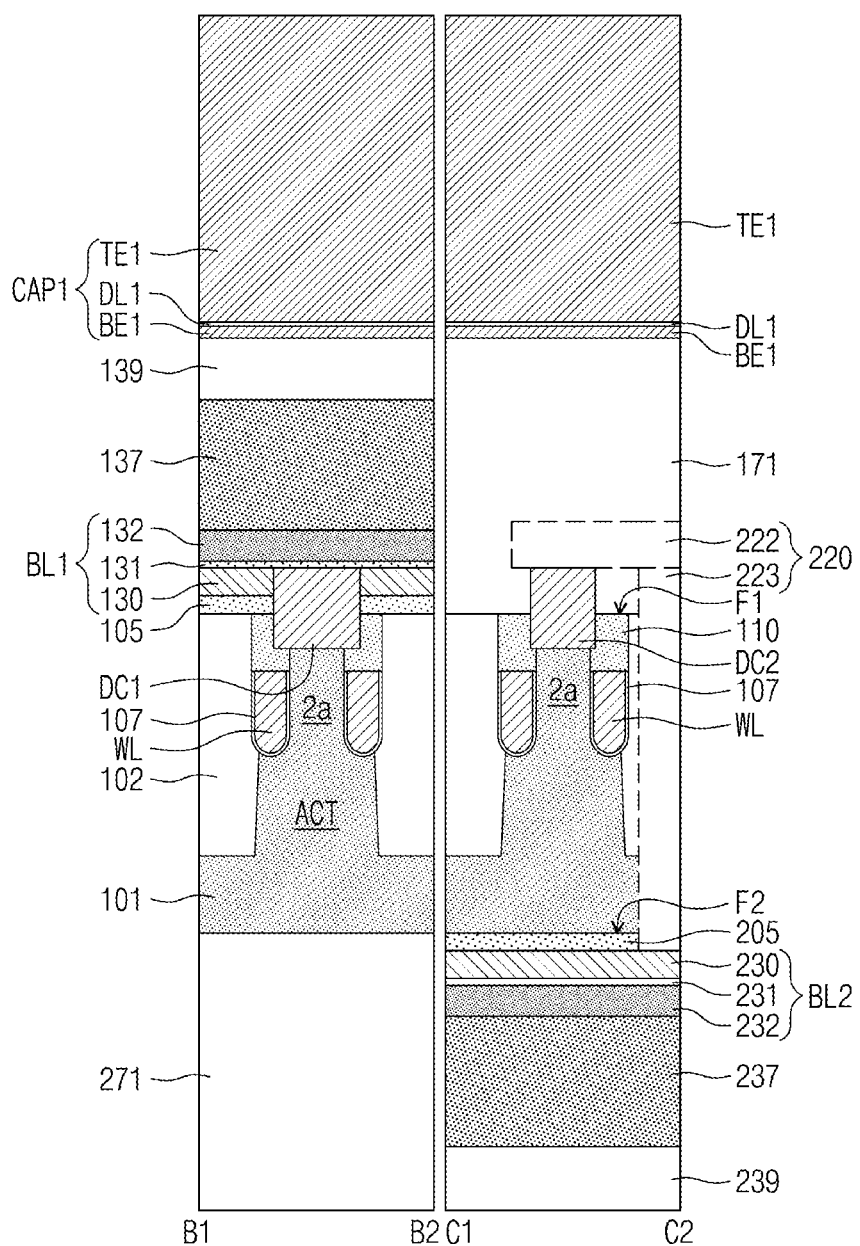
FIG. 4 illustrates a cross-sectional view along lines B1-B2 and C1-C2 of FIG. 1.

FIG. 3 is a plan view illustrating a semiconductor memory device 1001 according to an embodiment. FIG. 4 is a cross-sectional view along the lines B1-B2 and C1-C2 of FIG. 1. A cross-section along the line A1-A2 of FIG. 3 may be the same as FIG. 2A. For concise description, a previously described element may be identified by the same reference number without repeating an overlapping description thereof.

Referring to FIGS. 3 and 4, third contact plugs DC2 may be provided. For example, the third contact plugs DC2 may be extended from the first surface F1 of the substrate 101, and may be connected to the first impurity regions 2a of the second active regions ACT2. The third contact plugs DC2 may be aligned with, e.g., and overlap, the second bit lines BL2, as shown in FIG. 3. For example, the third contact plugs DC2 may be formed at least partially using a process of forming the first contact plugs DC1. In another example, the third contact plugs DC2 may be independently formed, regardless of the first contact plugs DC1. The second contact plugs DC2 may be provided to connect the connection conductive patterns 220 to the second bit lines BL2.

Each of the connection conductive patterns 220 may include a third penetration via 223, which is provided to penetrate the substrate 101 and is connected to the second bit line BL2, and a first connection line 222, which is extended to cross over the word lines WL. As an example, the third penetration via 223 may be provided to penetrate the substrate 101 completely (e.g., from the first surface F1 to the second surface F2). The first connection line 222 may be extended from a region on a top surface of the third penetration via 223 to a region on a top surface of the third contact plug DC2. For example, the third penetration via 223 and the first connection line 222 may be formed of or include at least one of metallic materials (e.g., tungsten, titanium, and tantalum) or conductive metal nitride materials (e.g., titanium nitride, tantalum nitride, and tungsten nitride).

FIGS. 5, 7, 9, 11, and 13 are plan views illustrating stages in a method of fabricating a semiconductor memory device according to an embodiment. FIGS. 6, 8, 10, 12, and 14 are cross-sectional views along lines A1-A2 and B1-B2 of FIGS. 5, 7, 9, 11, and 13, respectively.

Figure 5:
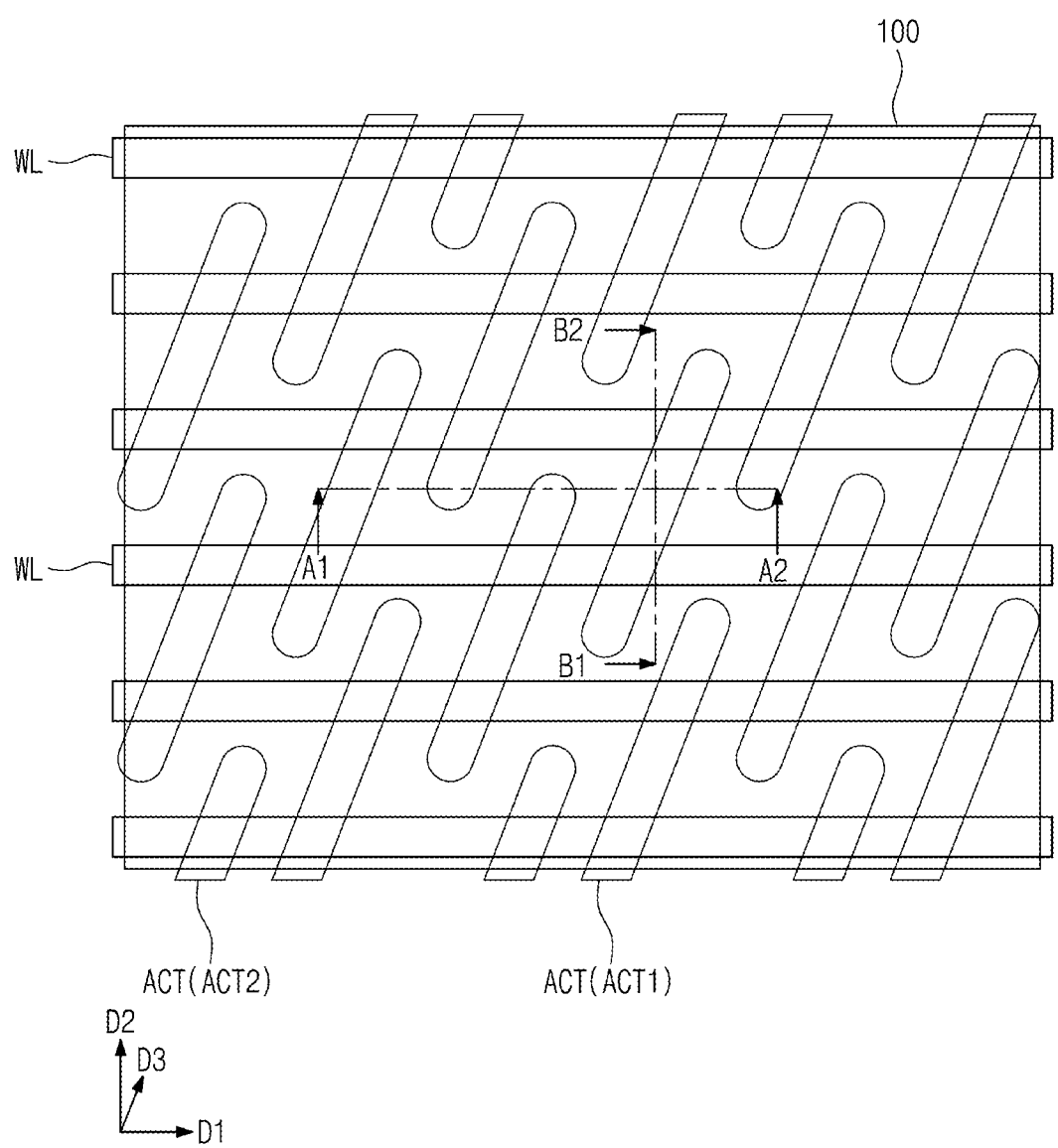
FIGS. 5, 7, 9, 11, and 13 illustrate plan views of stages in a method of fabricating a semiconductor memory device according to an embodiment.
Figure 6:
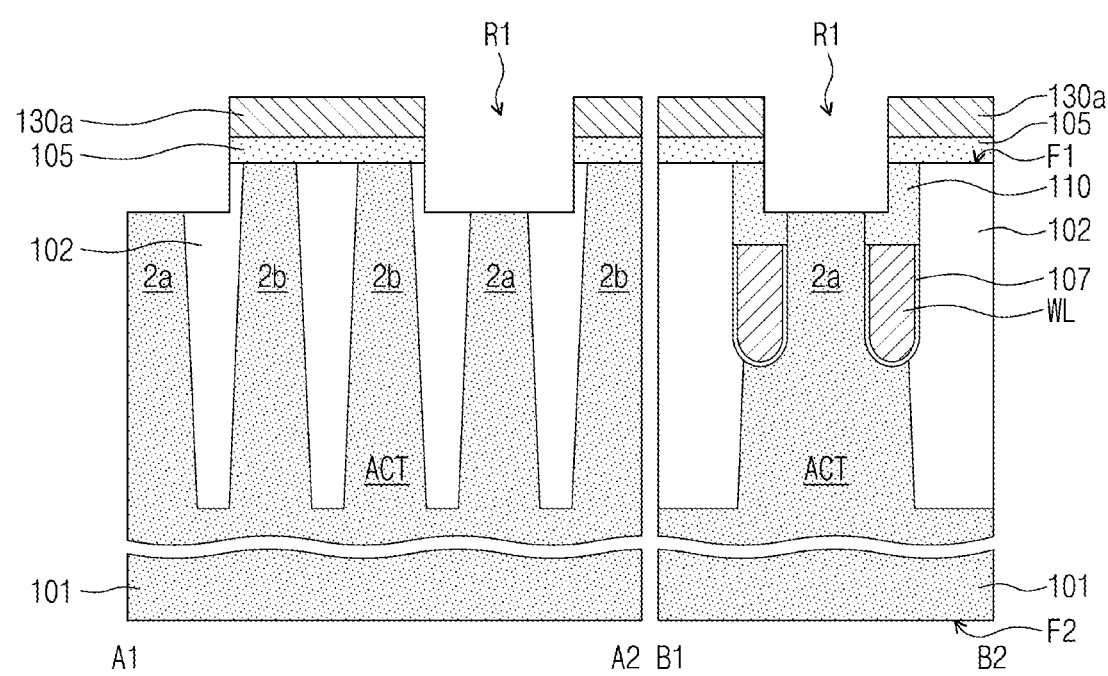
FIGS. 6, 8, 10, 12, and 14 illustrate cross-sectional views along lines A1-A2 and B1-B2 in each of FIGS. 5, 7, 9, 11, and 13, respectively.

Referring to FIGS. 5 and 6, the device isolation pattern 102 may be formed in the substrate 101 to define the active regions ACT. As an example, grooves may be formed in the substrate 101, and the device isolation pattern 102 may be formed by filling the grooves with an insulating material. Trenches may be formed by etching the active regions ACT and the device isolation pattern 102. The word lines WL may be formed in the trenches, respectively. A pair of the word lines WL may be formed to cross each of the active regions ACT. Before the formation of the word lines WL, the gate dielectric layer 107 may be formed on an inner surface of each of the trenches. The gate dielectric layer 107 may be formed by, e.g., a thermal oxidation process, a chemical vapor deposition process, and/or an atomic layer deposition process.

The word lines WL may be formed in the trenches by depositing a conductive layer on the substrate 101 to fill the trenches and performing an etch-back or chemical-mechanical polishing process on the conductive layer. The word lines WL may be recessed to have top surfaces that are lower than the top surfaces of the active regions ACT, e.g., relative to the second surface F2 of the substrate 101. An insulating layer (e.g., a silicon nitride layer) may be formed on the substrate 101 to fill the trenches and then may be planarized to form the word line capping patterns 110 on the word lines WL, respectively.

Impurities may be injected into the active regions ACT using the word line capping patterns 110 and the device isolation pattern 102 as a mask. Accordingly, the first and second impurity regions 2a and 2b may be formed in the active regions ACT. The first and second impurity regions 2a and 2b may have a different conductivity type from that of the substrate 101. For example, when the substrate 101 has a p-type conductivity, each of the first and second impurity regions 2a and 2b may have an n-type conductivity.

The first buffer insulating pattern 105 and a first mask pattern 130a may be formed on the substrate 101, e.g., on the first surface F1 of the substrate 101 defined by the top surfaces of the word line capping patterns 110 and the device isolation pattern 102. As an example, an insulating layer and a poly-silicon layer may be sequentially formed on the substrate 101. Thereafter, the first mask pattern 130a may be formed by the poly-silicon layer. The first recess regions R1 and the first buffer insulating pattern 105 may be formed by etching the insulating layer, the device isolation pattern 102, the substrate 101, and the word line capping patterns 110 using the first mask pattern 130a as an etch mask. The first recess regions R1 may be formed to expose some of the first impurity regions 2a. As an example, the first recess regions R1 may expose the first impurity regions 2a of the first active regions ACT1.

Figure 7:
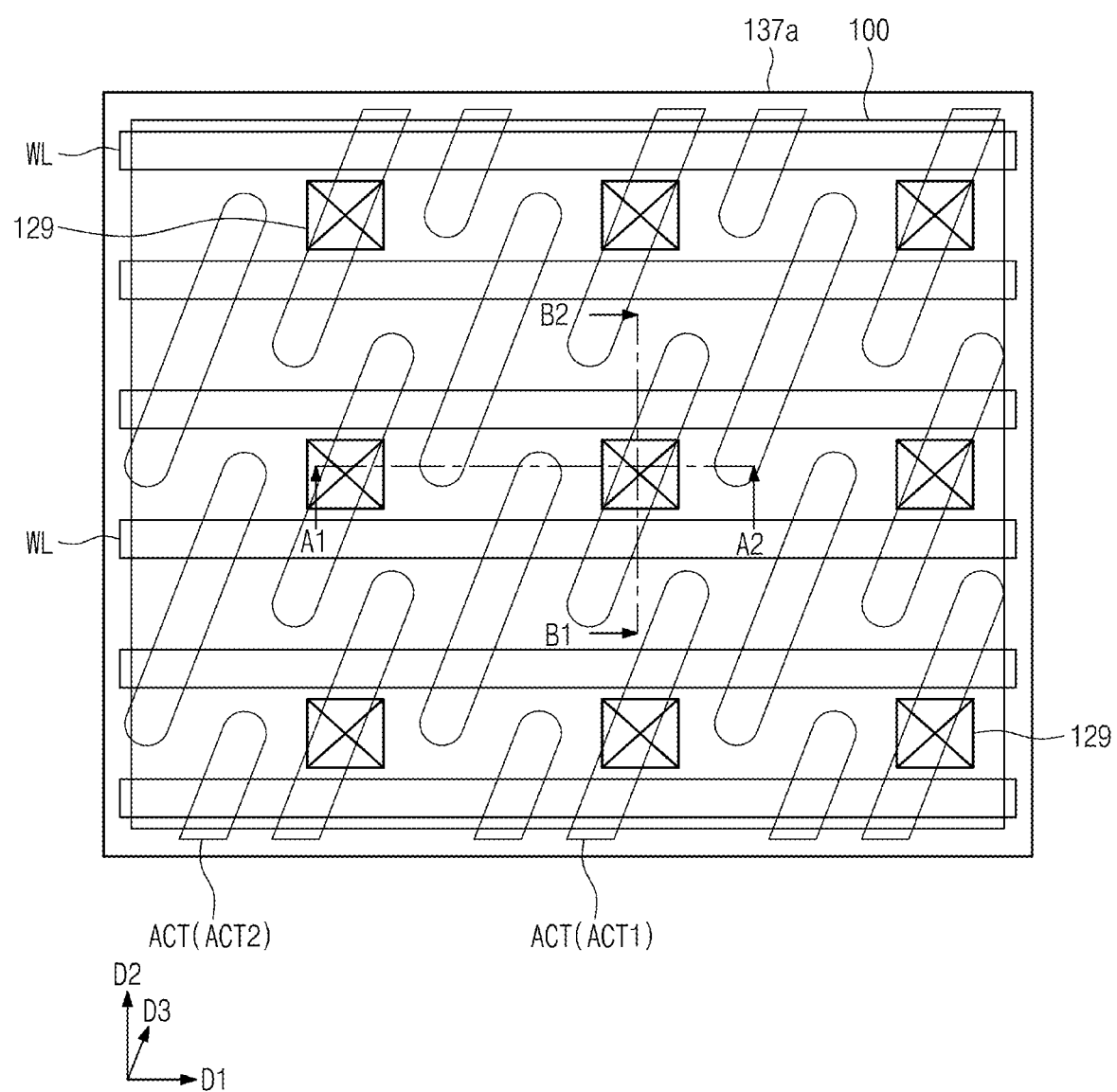
Figure 8:
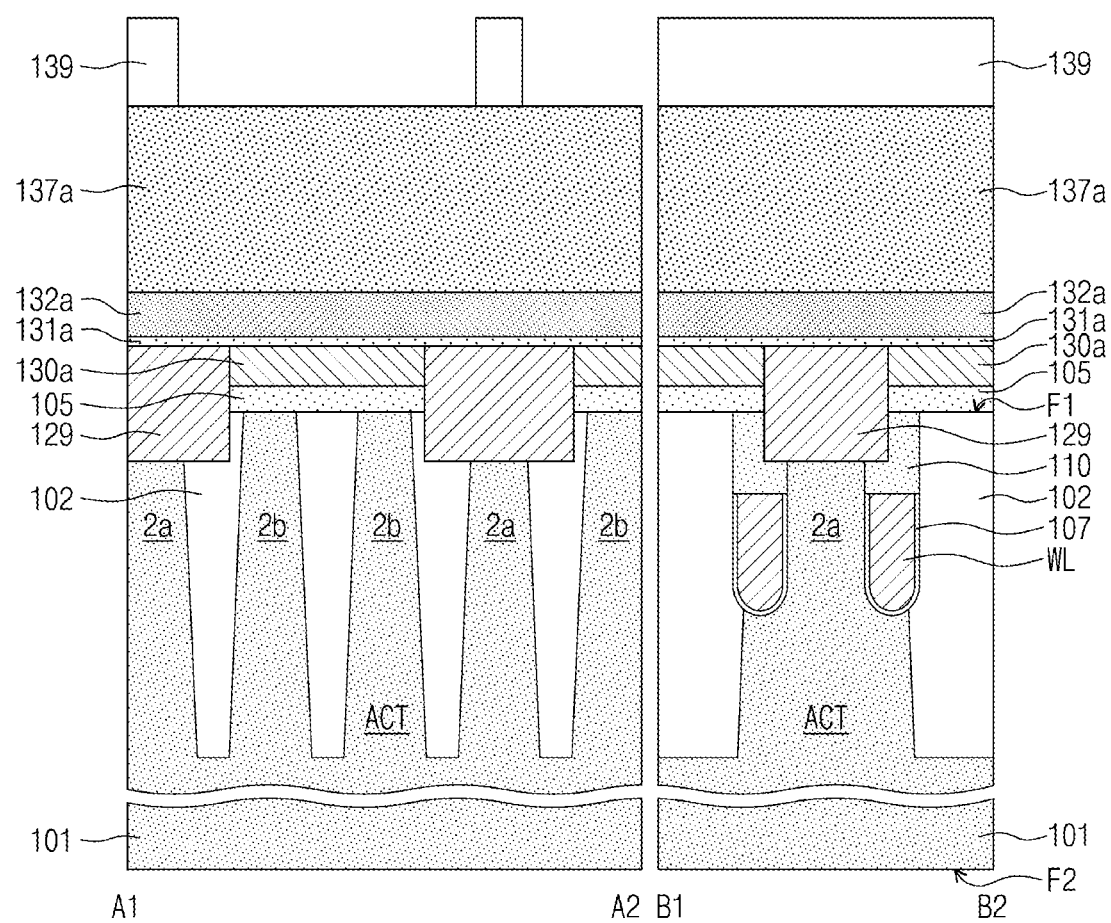

Referring to FIGS. 7 and 8, conductive patterns 129 may be formed to fill the first recess regions R1. As an example, the conductive patterns 129 may be formed of or include a polysilicon material. Thereafter, a planarization process may be performed.

An ohmic layer 131a, a metal-containing layer 132a, and a capping layer 137a may be sequentially formed on the first mask pattern 130a and the conductive patterns 129. The ohmic layer 131a may be formed of or include a metal silicide (e.g., cobalt silicide). The ohmic layer 131a may be formed by depositing a metal layer on the first mask pattern 130a and the conductive patterns 129 and performing a thermal treatment process. The thermal treatment process may be performed to react the metal layer with the first mask pattern 130a and the conductive patterns 129, and thereby to form a metal silicide. An unreacted portion of the metal layer may be removed. For example, the metal-containing layer 132a may be formed of or include at least one of metallic materials (e.g., tungsten, titanium, and tantalum) or conductive metal nitride materials (e.g., titanium nitride, tantalum nitride, and tungsten nitride). For example, the capping layer 137a may be formed of or include at least one of insulating materials (e.g., silicon nitride).

Second mask patterns 139 may be formed on the capping layer 137a to define planar shapes of the first bit lines BL1 to be described below. The second mask patterns 139 may be extended in the second direction D2 shown in FIG. 1. As an example, the second mask patterns 139 may be formed of or include at least one of an amorphous carbon layer, a silicon nitride layer, or a metal layer.

Figure 9:
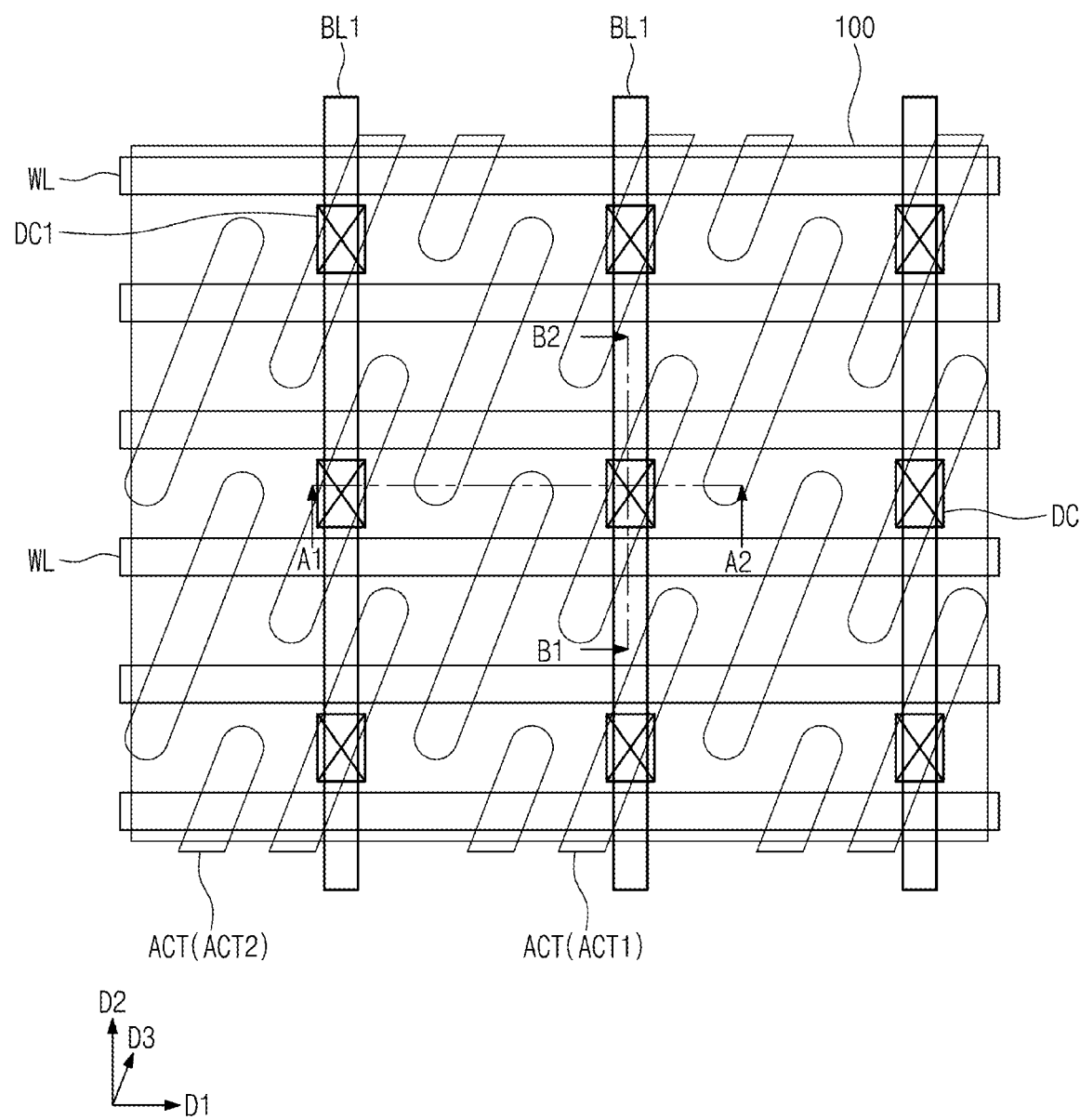
Figure 10:
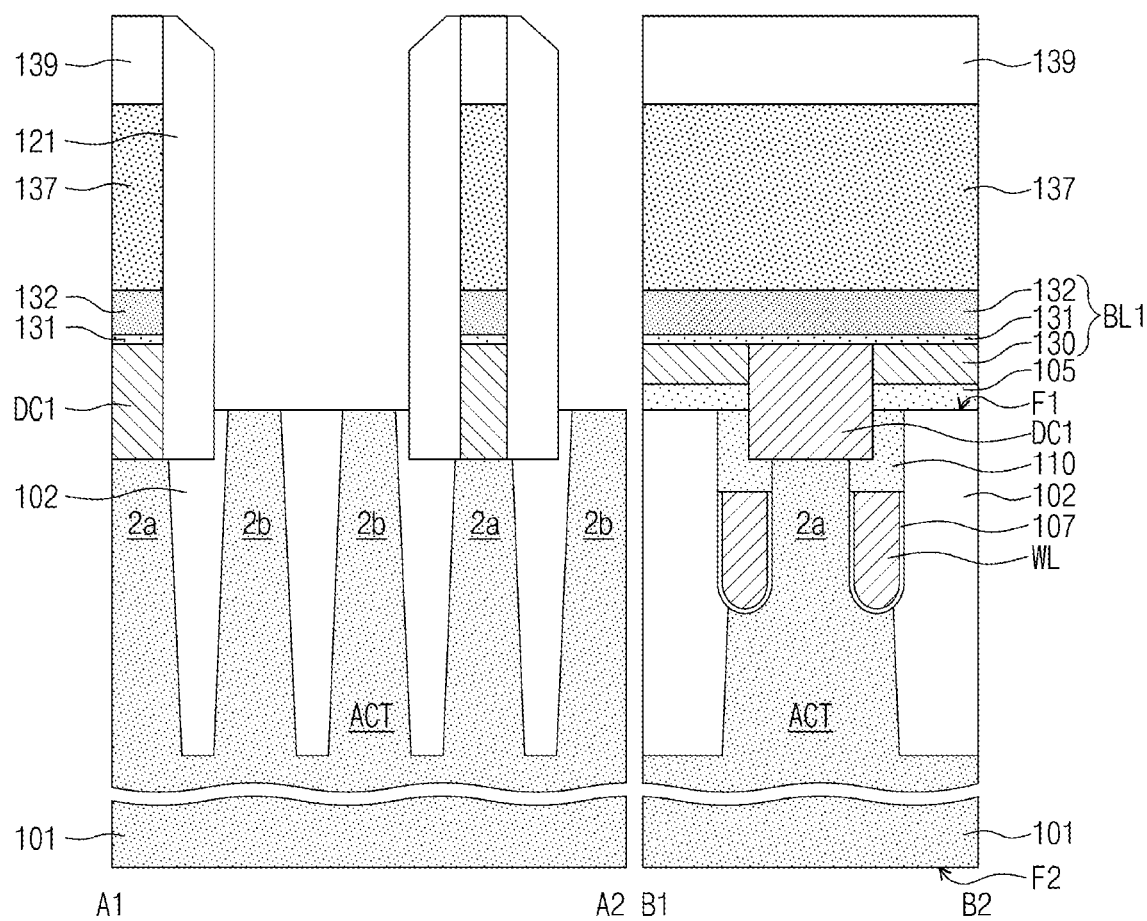

Referring to FIGS. 9 and 10, an etching process may be performed using the second mask patterns 139 as an etch mask to sequentially etch the capping layer 137a, the metal-containing layer 132a, the ohmic layer 131a, the first mask pattern 130a, and the conductive patterns 129, and as a result, the bit line capping patterns 137, the first bit lines BL1, and the first contact plugs DC1 may be formed. Each of the first bit lines BL1 may include the semiconductor pattern 130, the ohmic pattern 131, and the metal-containing pattern 132. The etching process may be performed to partially expose a top surface of the first buffer insulating pattern 105 and an inner side surface and a bottom surface of the first recess region R1.

The second mask patterns 139 may be removed, and then, the spacers 121 may be respectively formed on the side surfaces of the first bit lines BL1. The spacers 121 may cover the bottom surface and the inner side surface of the first recess region R1. The spacers 121 may be formed by depositing and etching a plurality of insulating layers. As an example, the formation of the spacers 121 may include sequentially forming a first silicon nitride layer, a silicon oxide layer, and a second silicon nitride layer. After the formation of the spacers 121, the second impurity regions 2b may be exposed.

Figure 11:
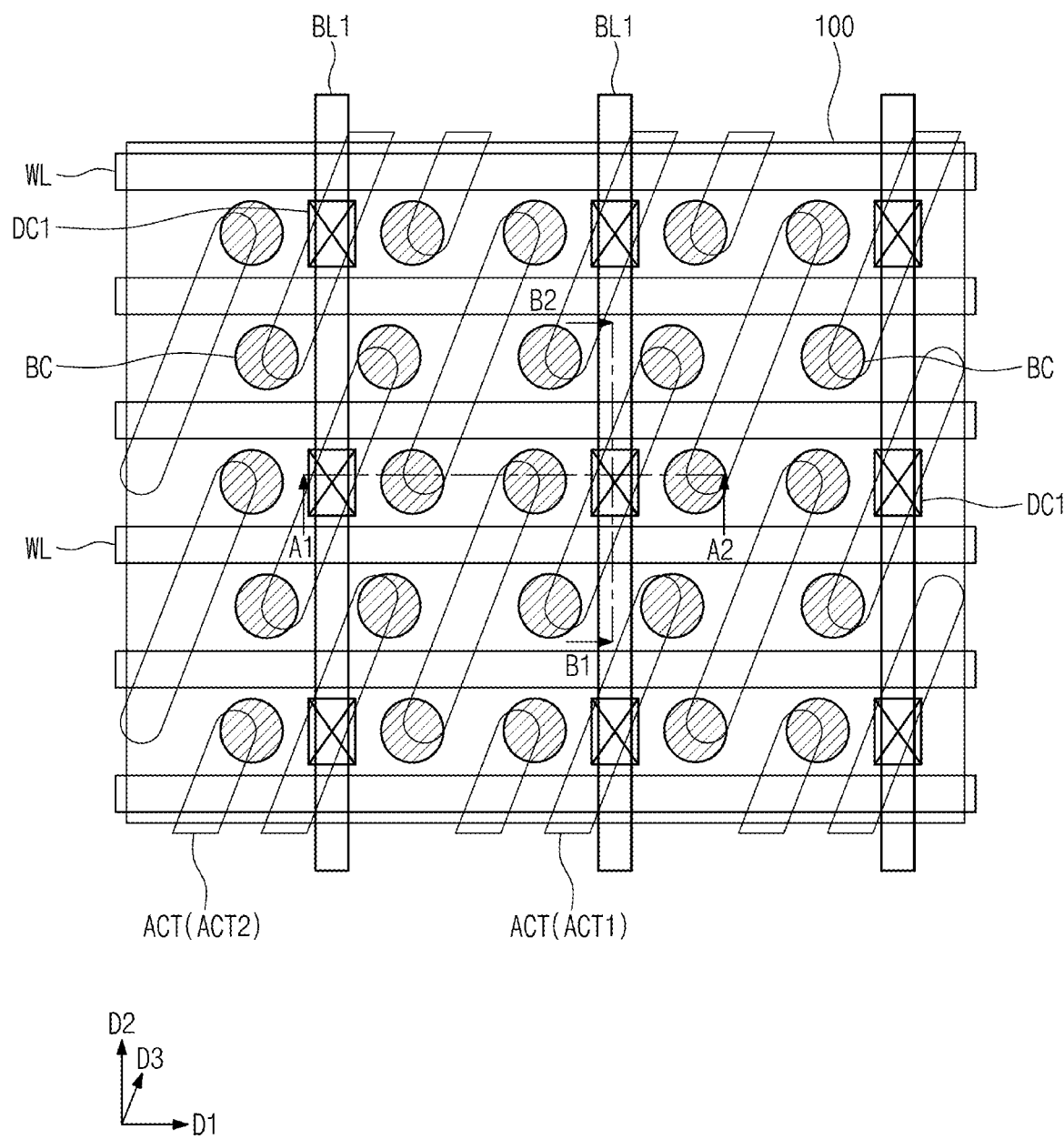
Figure 12:
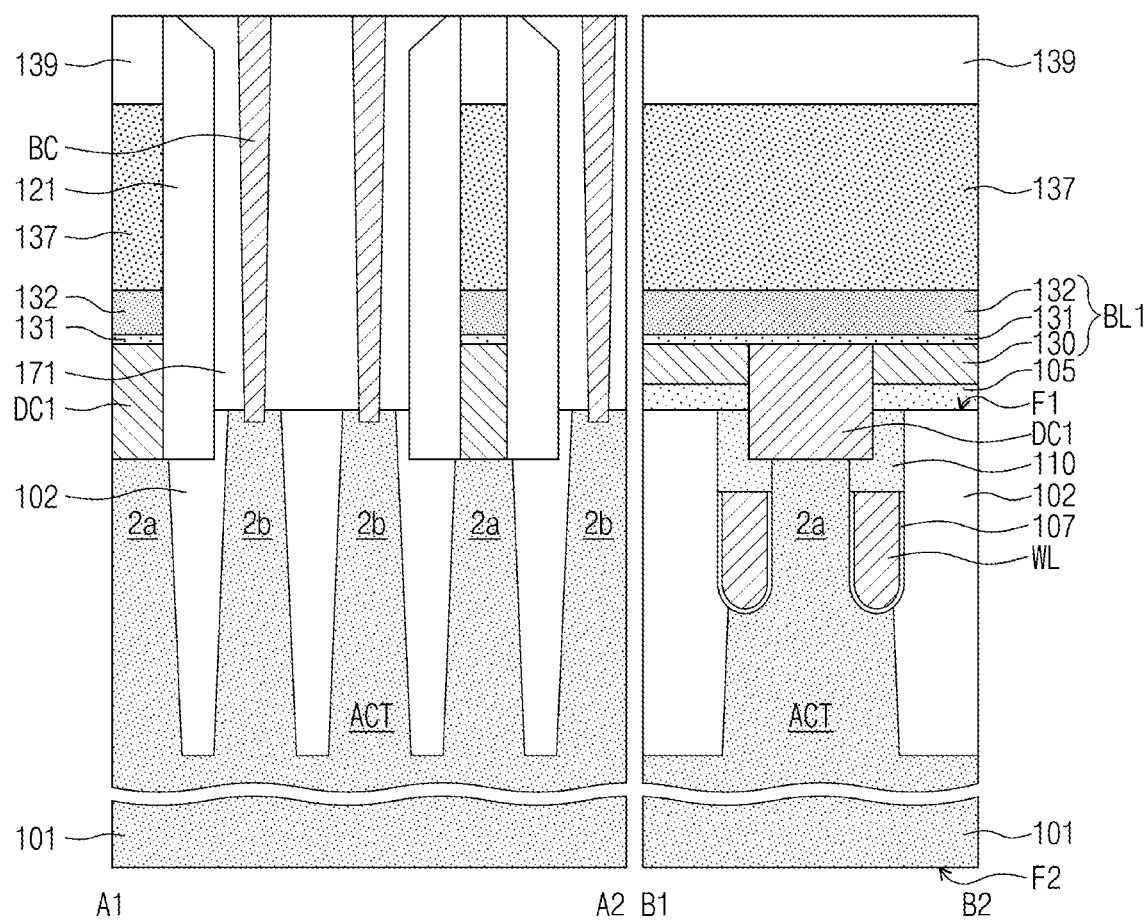

Referring to FIGS. 11 and 12, the first interlayer insulating layer 171 may be formed to fill a space between the first bit lines BL1. The first interlayer insulating layer 171 may be formed by depositing a silicon oxide layer and performing a planarization process on the silicon oxide layer to expose the second mask patterns 139.

The second contact plugs BC may be formed to penetrate the first interlayer insulating layer 171 and to be connected to the second impurity regions 2b. In the present embodiment, the second contact plugs BC may be formed on the second impurity regions 2b of the first and second active regions ACT1 and ACT2. The second contact plugs BC may be formed by forming holes to penetrate the first interlayer insulating layer 171 and filling the holes with a conductive material. As an example, the second contact plugs BC may be formed of or include at least one of tungsten or poly silicon.

Figure 13:
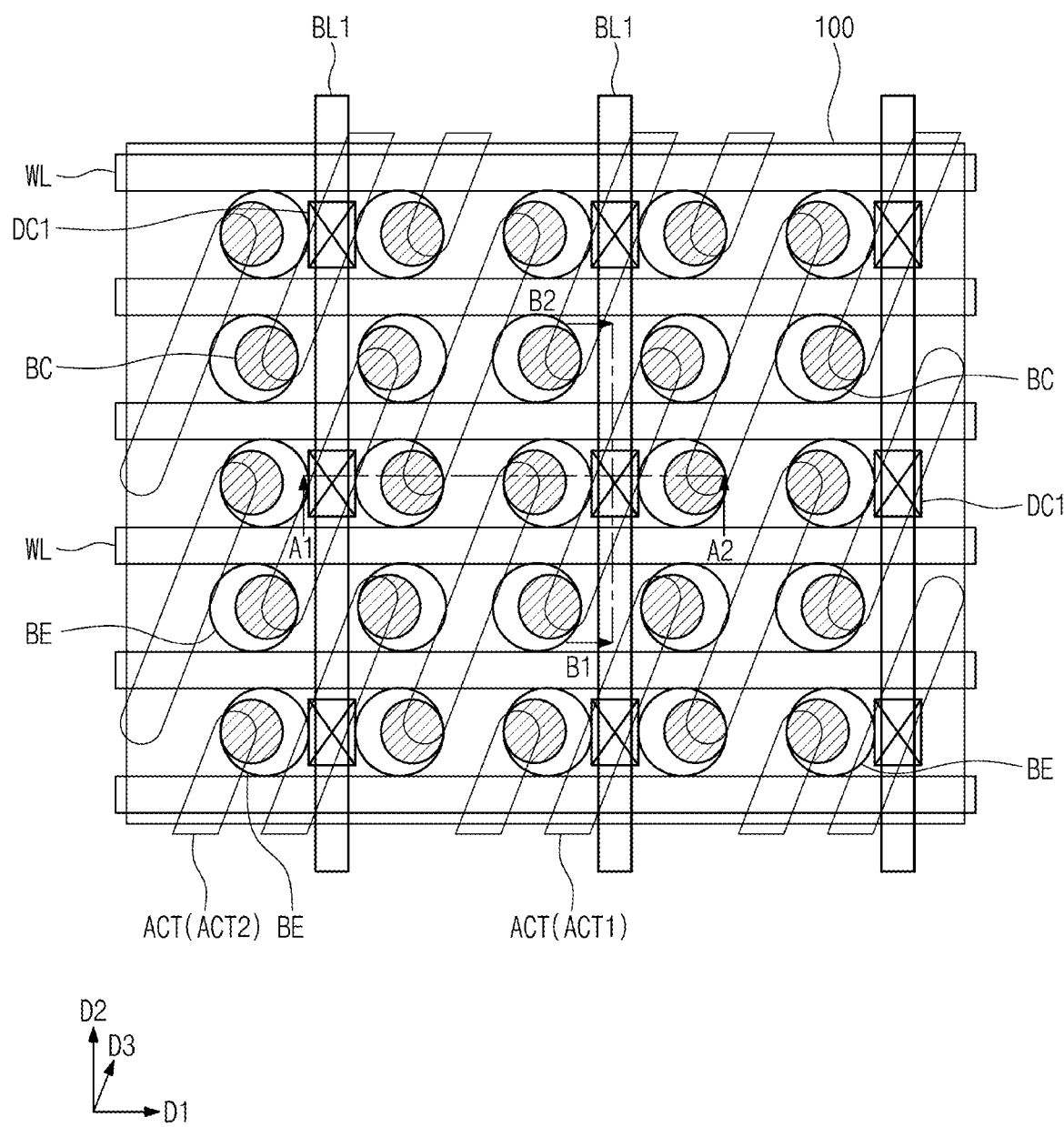
Figure 14:
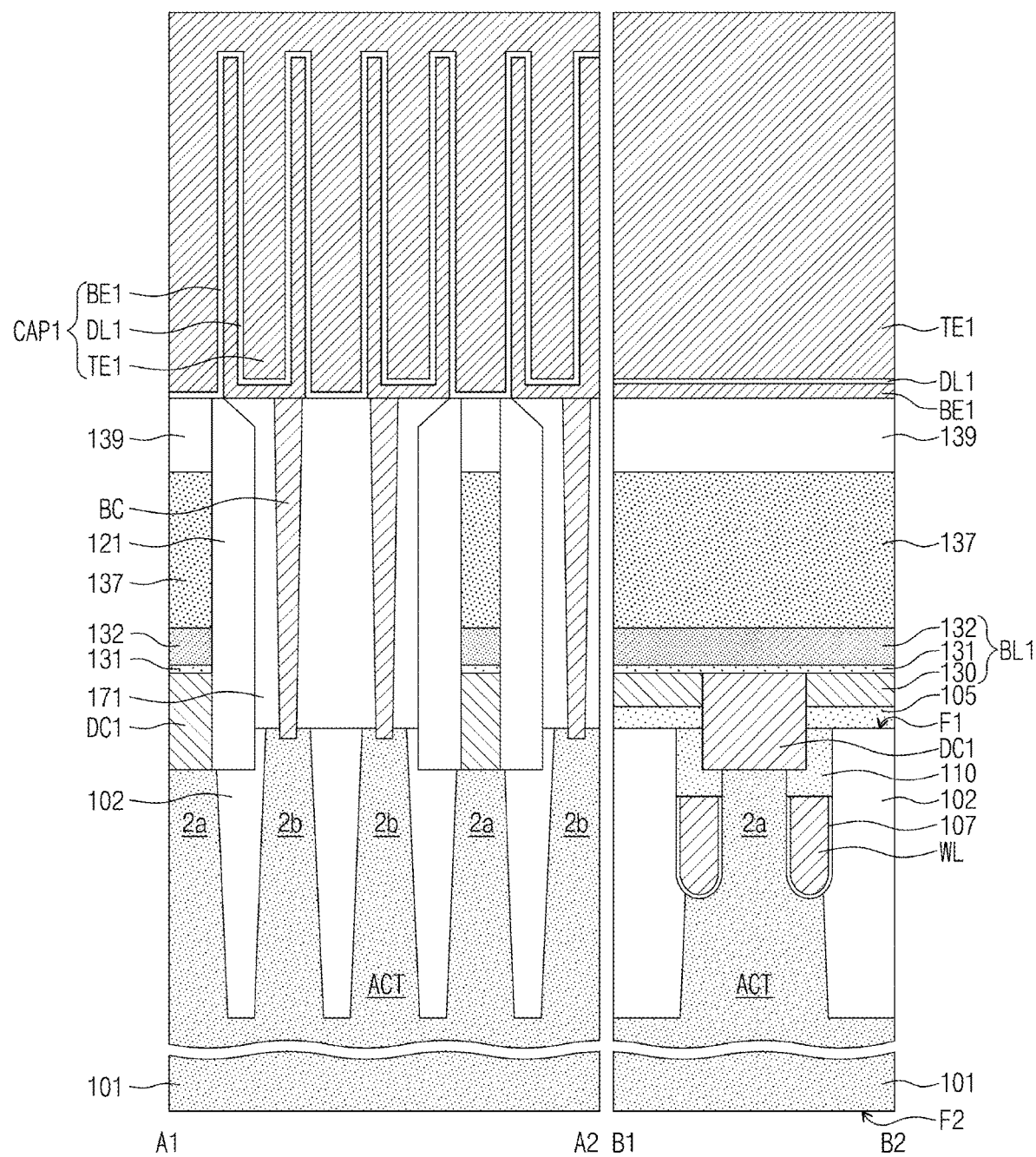

Referring to FIGS. 13 and 14, the first bottom electrodes BE1 may be formed on the second contact plugs BC, respectively. For example, the bottom electrode BE may be formed of or include at least one of doped poly-silicon, metal nitride materials (e.g., titanium nitride), or metallic materials (e.g., tungsten, aluminum, and copper). The formation of the bottom electrode BE1 may include forming a mold layer to cover the second contact plugs BC and forming electrode holes to penetrate the mold layer. Thereafter, an electrode layer may be formed to cover the electrode holes, and a planarization process may be performed on the electrode layer to form the first bottom electrodes BE1. The mold layer may include an insulating layer and at least one supporting layer, which has an etch rate different from the insulating layer.

The first dielectric layer DL1 may be provided to cover top and side surfaces of the first bottom electrodes BE1. The first dielectric layer DL1 may be a metal oxide layer, which contains at least one of, e.g., hafnium (Hf), niobium (Nb), titanium (Ti), tantalum (Ta), zirconium (Zr), chromium (Cr), cobalt (Co), iridium (Ir), molybdenum (Mo), osmium (Os), rhenium (Ra), rhodium (Rh), ruthenium (Ru), tungsten (W), or vanadium (V).

The first top electrode TE1 may be formed on the first dielectric layer DL1. For example, the first top electrode TE1 may be formed of or include at least one of doped poly-silicon, doped silicon-germanium, metal nitride materials (e.g., titanium nitride), or metallic materials (e.g., tungsten, aluminum, and copper). As a result, the formation of the first capacitor CAP1 may be finished.

Referring back to FIGS. 1, 2A, and 2B, a back grinding process (e.g., a polishing process on the second surface F2 of the substrate 101) may be performed. As a result of the back grinding process, a thickness of the substrate 101 may be reduced, and the second surface F2 may be placed at a level closer to the first surface F1.

The second buffer insulating pattern 205 and the semiconductor pattern 230 may be sequentially formed on the second surface F2 of the substrate 101. The connection conductive patterns 220 may be formed to penetrate the second buffer insulating pattern 205 and the semiconductor pattern 230. Each of the connection conductive patterns 220 may include the first and second penetration vias 201 and 202. As an example, the second penetration via 202 may be formed before the formation of the second buffer insulating pattern 205 and the semiconductor pattern 230, and the first penetration via 201 may be formed after the formation of the second buffer insulating pattern 205 and the semiconductor pattern 230. The first penetration via 201 and the second penetration via 202 may be formed of or include at least one of, e.g., tungsten, titanium, tantalum, and/or conductive nitrides thereof.

The second bit lines BL2, each of which includes the ohmic pattern 231 and the metal-containing pattern 232, and the bit line capping patterns 237 may be formed on the first penetration via 201. The second bit lines BL2 and the bit line capping patterns 237 may be formed by substantially the same method as the first bit lines BL1 and the bit line capping patterns 137. As an example, the third mask patterns 239 may be formed on the bit line capping patterns 237, and then, a patterning process may be performed.

The spacers 221 may be formed to cover side surfaces of the second bit lines BL2. Thereafter, the second interlayer insulating layer 271 may be formed to fill a region between the second bit lines BL2.

Figure 15:
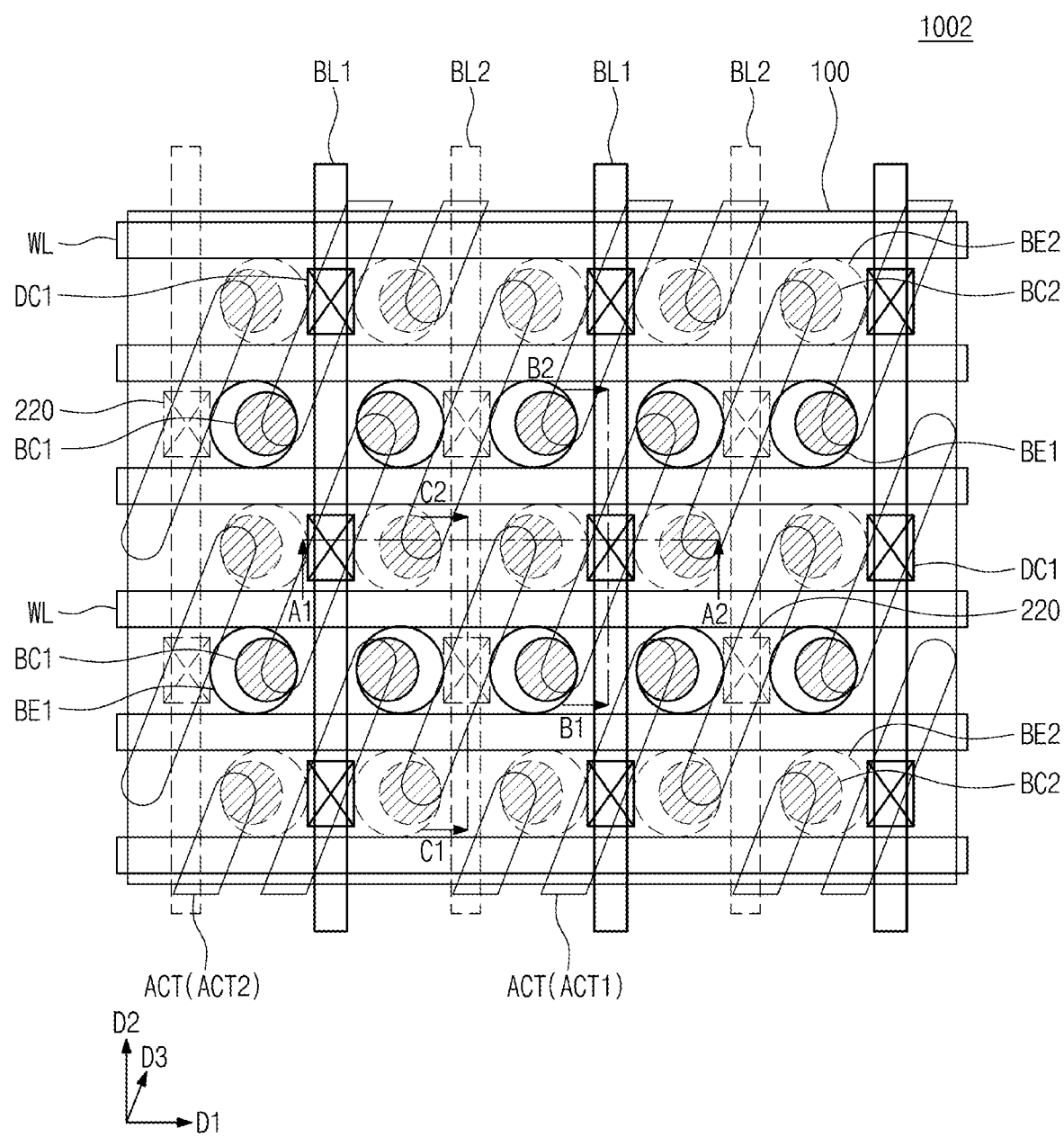
FIG. 15 illustrates a plan view of a semiconductor memory device according to an embodiment.
Figure 16A:
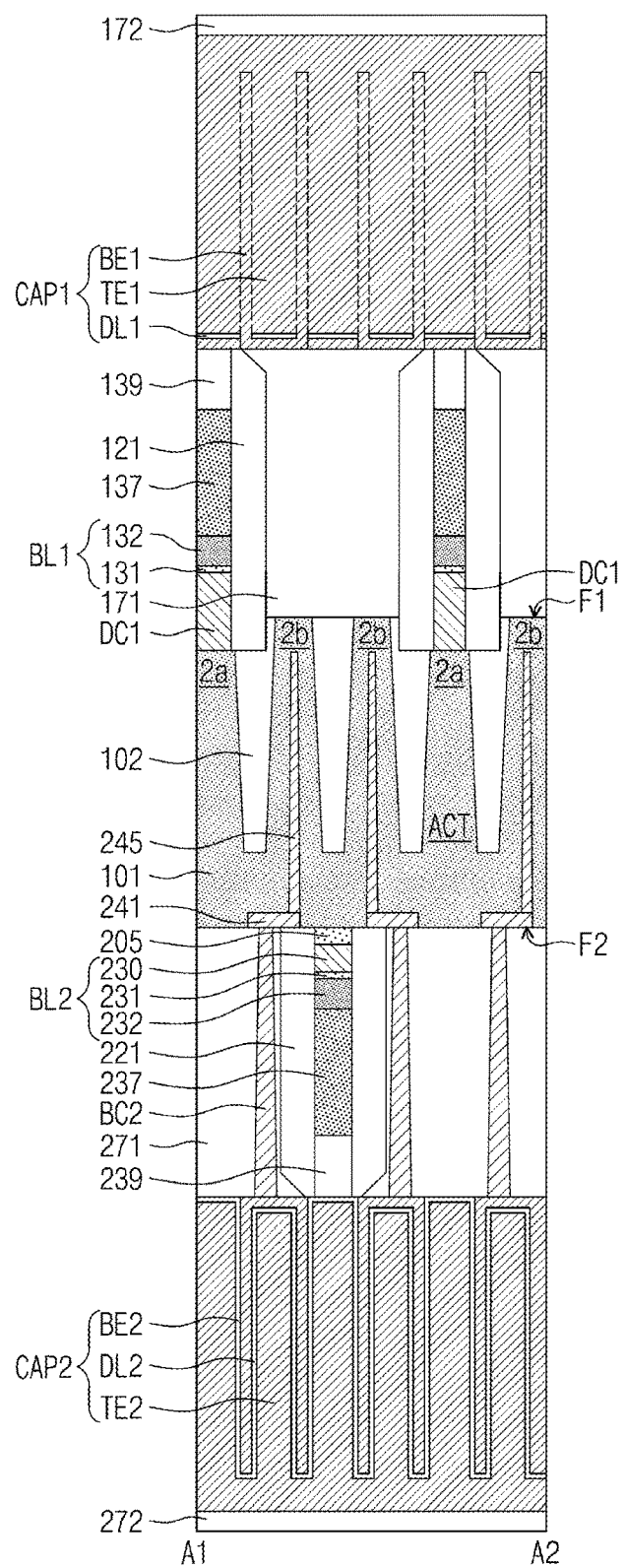
FIG. 16A illustrates a cross-sectional view along a line A1-A2 of FIG. 15.
Figure 16B:
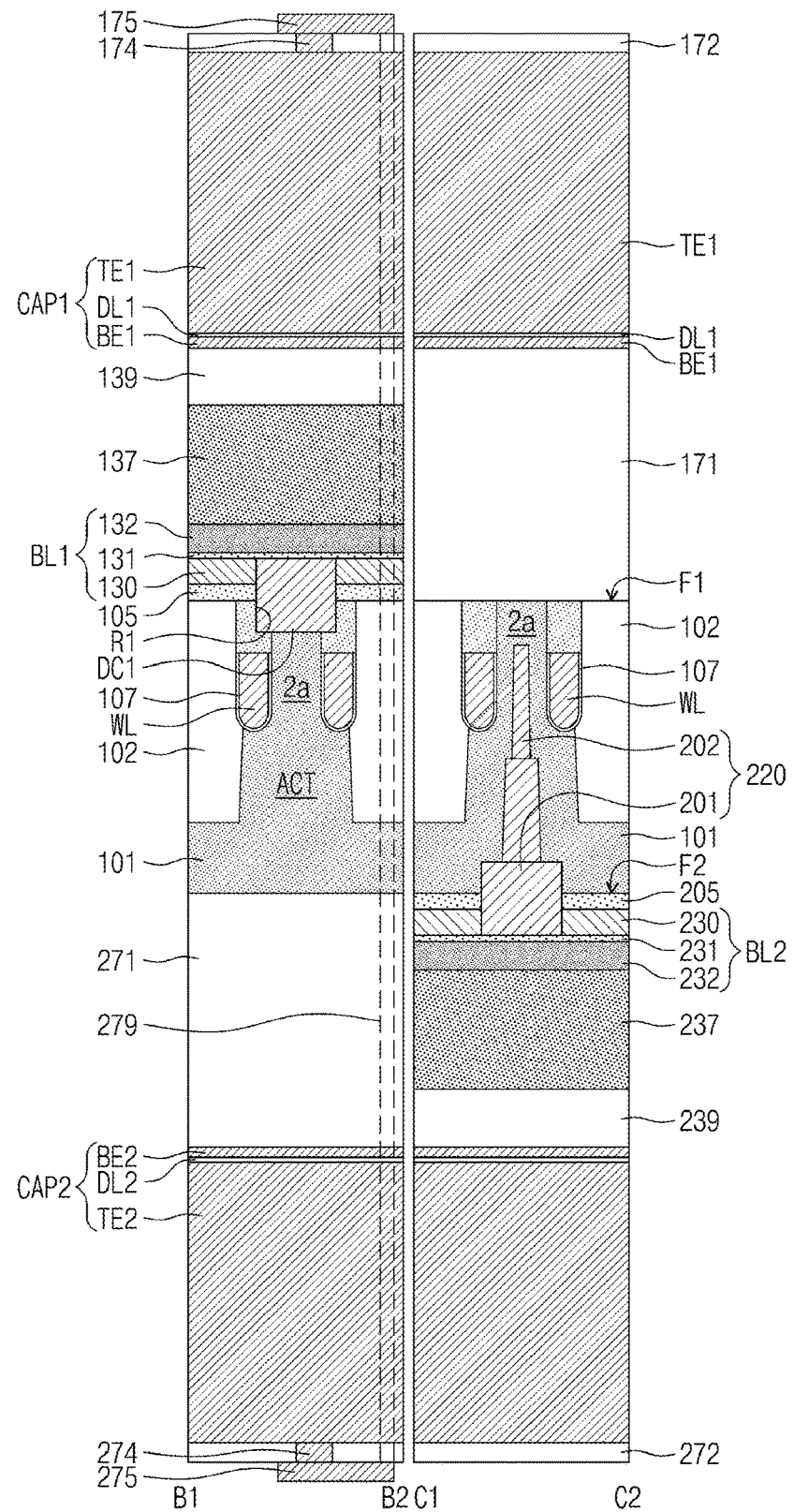
FIG. 16B illustrates a cross-sectional view along lines B1-B2 and C1-C2 of FIG. 15.

FIG. 15 is a plan view illustrating a semiconductor memory device 1002 according to an embodiment. FIG. 16A is a cross-sectional view along a line A1-A2 of FIG. 15. FIG. 16B is a cross-sectional view along lines B1-B2 and C1-C2 of FIG. 15. For concise description, a previously described element may be identified by the same reference number without repeating an overlapping description thereof.

Referring to FIGS. 15, 16A, and 16B, the first capacitor CAP1 may be provided on the first surface F1 of the substrate 101, and a second capacitor CAP2 may be provided on the second surface F2 of the substrate 101. The first capacitor CAP1 may include the first bottom electrodes BE1, the first dielectric layer DL1, and the first top electrode TE1 The second capacitor CAP2 may include second bottom electrodes BE2, a second dielectric layer DL2, and a second top electrode TE2.

The first bit lines BL1, the first contact plugs DC1, and second contact plugs BC1 may be provided between the first surface F1 of the substrate 101 and the first capacitor CAP1. The second contact plugs BC1 may be provided to connect the second impurity regions 2b of the first active regions ACT1 to the first bottom electrodes BE1 of the first capacitor CAP1.

The second bit lines BL2, the connection conductive patterns 220, and fourth contact plugs BC2 may be provided between the second surface F2 of the substrate 101 and the second capacitor CAP2. The fourth contact plugs BC2 may be provided to penetrate the second interlayer insulating layer 271. The fourth contact plugs BC2 may have bottom surfaces that are in contact with the second bottom electrodes BE2 of the second capacitor CAP2. The fourth contact plugs BC2 may be provided to electrically connect the second impurity regions 2b of the second active regions ACT2 to the second bottom electrodes BE2 of the second capacitor CAP2.

Fourth penetration vias 245 may be provided to connect the fourth contact plugs BC2 to the second impurity regions 2*b* of the second active regions ACT2. The fourth penetration vias 245 and the fourth contact plugs BC2 may be connected to each other through second connection lines 241. A width of the fourth penetration vias 245 may be smaller than a width of the fourth contact plugs BC2.

A third interlayer insulating layer 172 may be provided on the first capacitor CAP1, and a fourth interlayer insulating layer 272 may be provided on the second capacitor CAP2. The third and fourth interlayer insulating layers 172 and 272 may include, e.g., a silicon oxide layer. A capacitor interconnection line may be provided to electrically connect the first top electrode TE1 of the first capacitor CAP1 to the second top electrode TE2 of the second capacitor CAP2. The capacitor interconnection line may include a fifth penetration via 279 penetrating the substrate 101. The fifth penetration via 279 may include a plurality of penetration vias. The capacitor interconnection line may include a third connection line 175 and a first plug 174, which are provided to connect the fifth penetration via 279 to the first top electrode TE1 of the first capacitor CAP1. The capacitor interconnection line may include a fourth connection line 275 and a second plug 274, which are provided to connect the fifth penetration via 279 to the second top electrode TE2 of the second capacitor CAP2.

According to an embodiment, some of the capacitors may be disposed on the first surface of the substrate, and some of the capacitors may be disposed on the second surface of the substrate. Accordingly, it may be possible to increase a process margin in a process of forming the capacitor and to increase a sensing margin of a semiconductor memory device.

Figure 17:
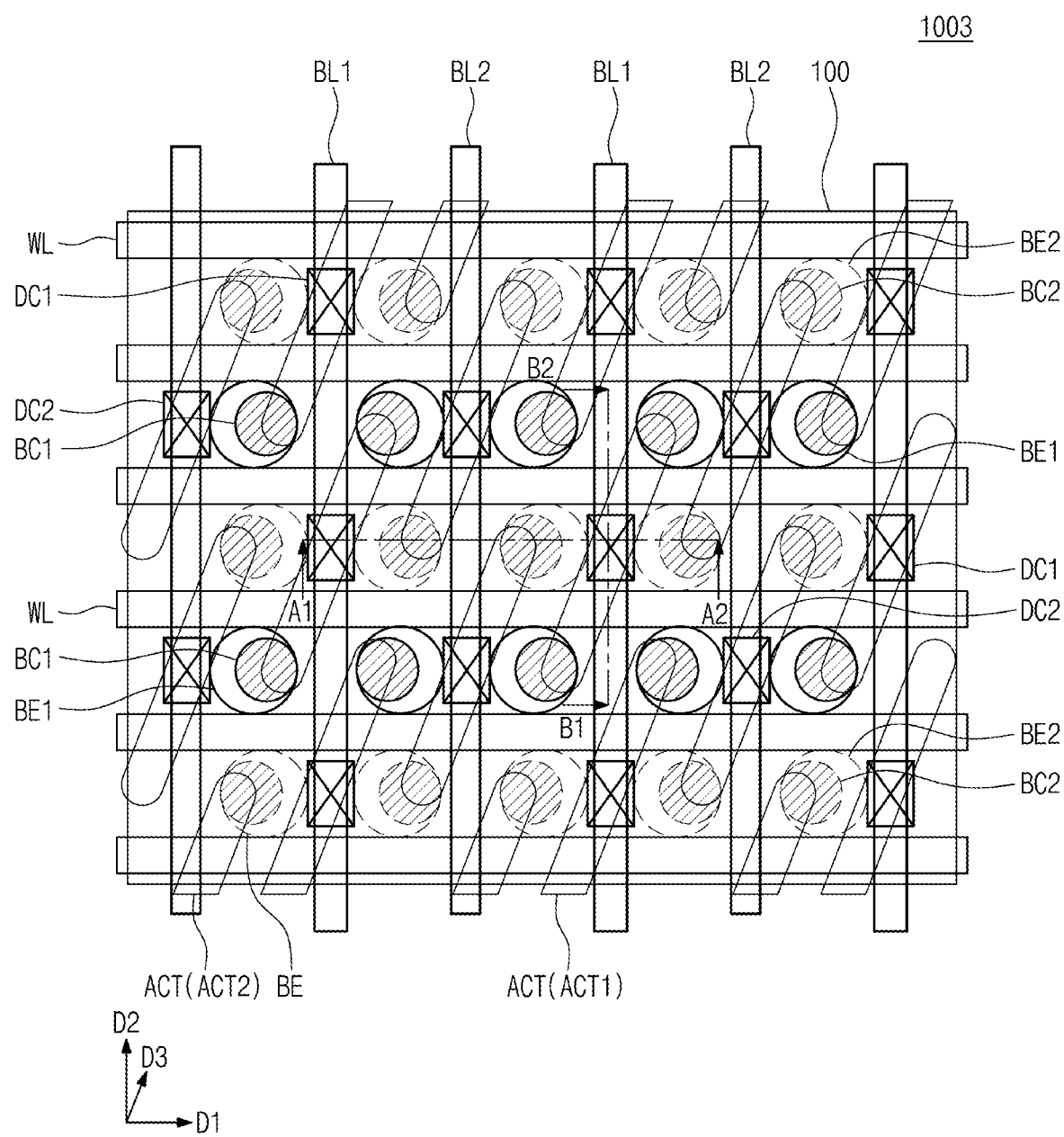
FIG. 17 illustrates s a plan view of a semiconductor memory device according to an embodiment.
Figure 18:
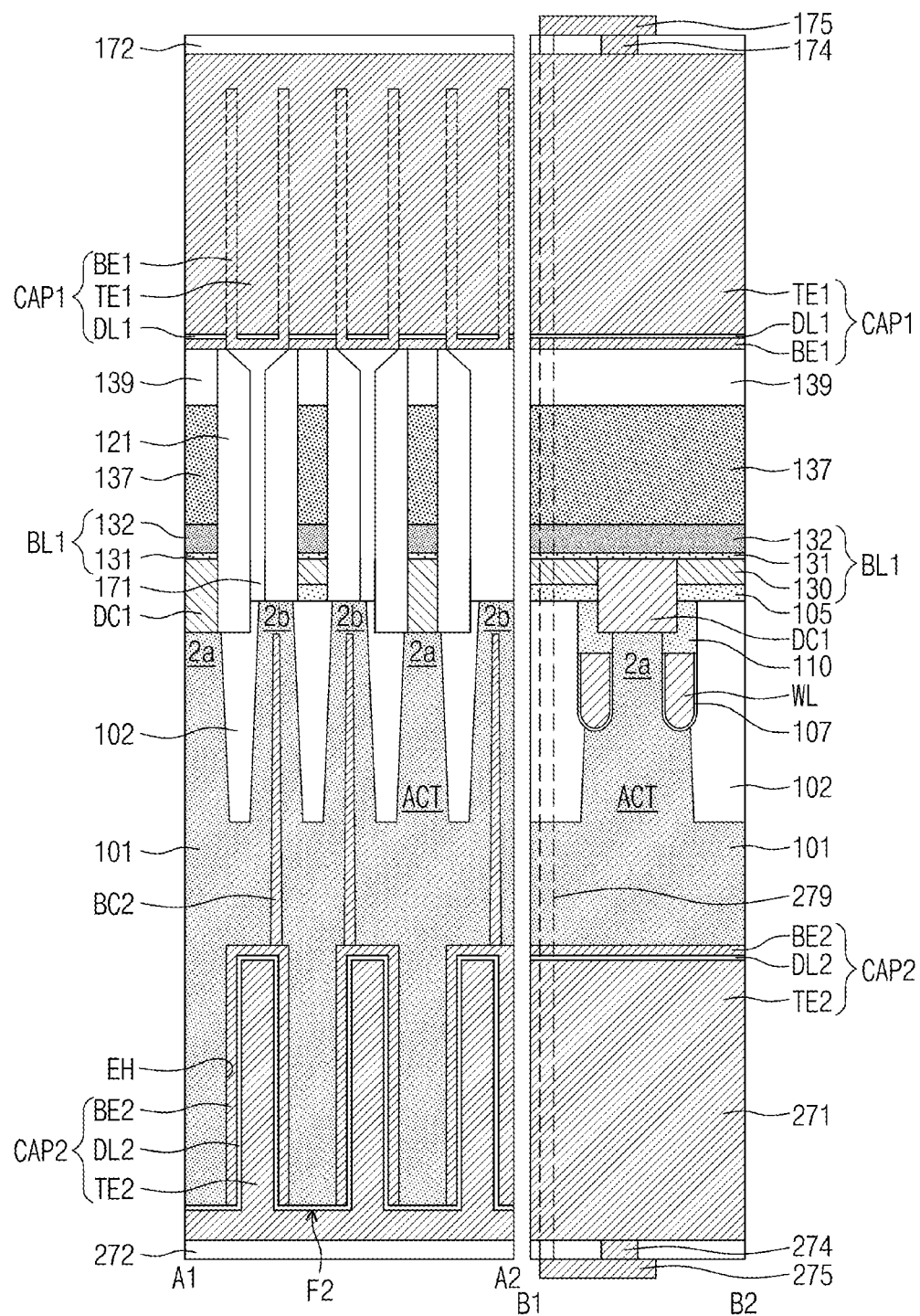
FIG. 18 illustrates a cross-sectional view along lines A1-A2 and B1-B2 of FIG. 17.

FIG. 17 is a plan view illustrating a semiconductor memory device 1003 according to an embodiment. FIG. 18 is a cross-sectional view taken along lines A1-A2 and B1-B2 of FIG. 17. For concise description, a previously described element may be identified by the same reference number without repeating an overlapping description thereof.

Referring to FIGS. 17 and 18, in the present embodiment, the first bit lines BL1 and the first contact plugs DC1, which are connected to the first impurity regions 2*a* of the first active regions ACT1, and the second bit lines BL2 and the third contact plugs DC2, which are connected to the first impurity regions 2*a* of the second active regions ACT2, may be provided on the first surface F1 of the substrate 101.

The semiconductor memory device according to the present embodiment may include the second capacitor CAP2, which is buried in the second surface F2 of the substrate 101, e.g., the second capacitor CAP2 may extend into the substrate 101 from the second surface F2. The second bottom electrodes BE2 of the second capacitor CAP2 may be provided in electrode holes EH, respectively, which are extended in a direction from the second surface F2 of the substrate 101 toward the first surface F1. The second dielectric layer DL2 and the second top electrode TE2 of the second capacitor CAP2 may fill remaining portions of the electrode holes EH, e.g., the second dielectric layer DL2 may extend conformally and directly on the bottom electrodes BE2 and the second surface F2 of the substrate 101. For example, the second bottom electrodes BE2 and the substrate 101 may be spaced apart from each other with an insulating layer interposed therebetween. In another example, the second bottom electrodes BE2 and the substrate 101 may be in direct contact with each other. The fourth contact plugs BC2 may be provided to connect the second impurity regions 2*b* of the second active regions ACT2 to the second bottom electrodes BE2 of the second capacitor CAP2. For example, the fourth contact plugs BC2 may be directly connected to the second bottom electrodes BE2.

According to an embodiment, some of bit lines or capacitors may be formed on a first surface of a substrate, and the others may be formed on a second surface of the substrate. As a result, it may be possible to increase an integration density and a sensing margin of a semiconductor memory device.

By way of summation and review, as a design rule of a semiconductor memory device, e.g., a dynamic random-access memory (DRAM) device, decreases, a bottom electrode of a capacitor may be oxidized, thereby increasing a difference between the largest and smallest values of electrostatic capacitance. Thus, there is an increasing demand for a semiconductor memory device, which is configured to reduce the variation in the electrostatic capacitance, and a method of fabricating the same.

According to example embodiments, a semiconductor memory device with an increased integration density and an increased sensing margin may be provided. That is, according to example embodiments, capacitors and/or bit lines of the DRAM device may be formed on opposite, i.e., bottom and top, surfaces of the substrate in a dispersed manner, thereby increasing a process margin in a process of fabricating the DRAM device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
   a substrate including active regions, the active regions having first impurity regions and second impurity regions;
   word lines on a first surface of the substrate, the word lines extending in a first direction;
   first bit lines on the word lines, the first bit lines extending in a second direction crossing the first direction, and the first bit lines being connected to the first impurity regions;
   first contact plugs between the first bit lines, the first contact plugs being connected to the second impurity regions, respectively;
   second bit lines on a second surface of the substrate, the second bit lines being electrically connected to the first impurity regions; and
   a first capacitor on the first contact plugs.

2. The semiconductor memory device as claimed in claim 1, wherein, when viewed in a plan view, the first bit lines and the second bit lines are alternately and repeatedly disposed in the first direction.

3. The semiconductor memory device as claimed in claim 2, wherein:

the active regions are arranged in a plurality of columns extended in the second direction, the plurality of columns being spaced apart from each other in the first direction, and the plurality of columns of the active regions include first columns connected to the first bit lines and second columns connected to the second bit lines.

4. The semiconductor memory device as claimed in claim 1, further comprising connection conductive patterns connecting the second bit lines to the first impurity regions, the connection conductive patterns extending from the second surface of the substrate toward the first surface.

5. The semiconductor memory device as claimed in claim 4, wherein each of the connection conductive patterns includes:

a first penetration via connected to a corresponding one of the second bit lines; and a second penetration via on the first penetration via, the second penetration via connecting the first penetration via to a respective one of the first impurity regions, and a width of the first penetration via being larger than a width of the second penetration via.

6. The semiconductor memory device as claimed in claim 5, wherein the second penetration via extends into a region between the word lines.

7. The semiconductor memory device as claimed in claim 4, wherein each of the connection conductive patterns includes:

a third penetration via penetrating the substrate and connected to a corresponding one of the second bit lines; and a connection line extending to a region on a respective ones of the word lines.

8. The semiconductor memory device as claimed in claim 1, further comprising:

second contact plugs on the second surface of the substrate, the second contact plugs being electrically connected to the second impurity regions; and a second capacitor on bottom surfaces of the second contact plugs.

9. The semiconductor memory device as claimed in claim 8, further comprising fourth penetration vias buried in the substrate, the fourth penetration vias connecting the second contact plugs to the second impurity regions.

10. The semiconductor memory device as claimed in claim 8, wherein:

the first capacitor includes first bottom electrodes and a first top electrode, the second capacitor includes second bottom electrodes and a second top electrode, and the semiconductor memory device further comprises a capacitor interconnection line connecting the first top electrode to the second top electrode, the capacitor interconnection line including a fifth penetration via penetrating the substrate.

11. A semiconductor memory device, comprising:

a substrate including active regions, the active regions having first impurity regions and second impurity regions;

word lines on a first surface of the substrate, the word lines extending in a first direction;

first bit lines on the word lines, the first bit lines extending in a second direction crossing the first direction, and the first bit lines being connected to the first impurity regions;

first contact plugs between the first bit lines, the first contact plugs being connected to the second impurity regions, respectively;

a first capacitor on the first contact plugs;

second contact plugs on a second surface of the substrate, the second contact plugs being electrically connected to the second impurity regions; and a second capacitor on bottom surfaces of the second contact plugs.

12. The semiconductor memory device as claimed in claim 11, further comprising fourth penetration vias buried in the substrate, the fourth penetration vias connecting the second contact plugs to the second impurity regions.

13. The semiconductor memory device as claimed in claim 11, wherein:

the first capacitor includes first bottom electrodes and a first top electrode, the second capacitor includes second bottom electrodes and a second top electrode, and the semiconductor memory device further comprises a capacitor interconnection line connecting the first top electrode to the second top electrode, the capacitor interconnection line including a fifth penetration via penetrating the substrate.

14. The semiconductor memory device as claimed in claim 11, wherein at least a portion of the second capacitor is buried in the substrate.

15. The semiconductor memory device as claimed in claim 11, further comprising second bit lines on the second surface of the substrate, the second bit lines being electrically connected to the first impurity regions, and the second bit lines being between the second capacitor and the second surface of the substrate.

16. The semiconductor memory device as claimed in claim 15, wherein, when viewed in a plan view, the first bit lines and the second bit lines are alternately and repeatedly disposed in the first direction.

17. The semiconductor memory device as claimed in claim 16, wherein:

the active regions are arranged in a plurality of columns extending in the second direction, the plurality of columns being spaced apart from each other in the first direction, and the plurality of columns of the active regions include first columns connected to the first bit lines and second columns connected to the second bit lines.

18. The semiconductor memory device as claimed in claim 15, further comprising connection conductive patterns connecting the second bit lines to the first impurity regions, the connection conductive patterns extending from the second surface of the substrate toward the first surface.

19. The semiconductor memory device as claimed in claim 18, wherein each of the connection conductive patterns includes:

a first penetration via connected to a corresponding second bit line of the second bit lines; and a second penetration via on the first penetration via, the second penetration via connecting the first penetration via to a corresponding first impurity region of the first impurity regions, and a width of the first penetration via being larger than a width of the second penetration via.

20. A semiconductor memory device, comprising:

a substrate including active regions having first impurity regions and second impurity regions;

word lines on a first surface of the substrate, the word lines extending in a first direction;

first bit lines on the word lines, the first bit lines extending in a second direction crossing the first direction, and the first bit lines being connected to the first impurity regions;
first contact plugs between the first bit lines, the first contact plugs being connected to the second impurity regions, respectively;
second bit lines on a second surface of the substrate, the second bit lines being electrically connected to the first impurity regions, and the first bit lines and the second bit lines being alternatively disposed in the first direction, when viewed in a plan view; and
a first capacitor on the first contact plugs, the first capacitor including bottom electrodes and a top electrode.

* * * * *